(12) United States Patent
Bacchi et al.

(10) Patent No.: US 6,438,460 B1
(45) Date of Patent: Aug. 20, 2002

(54) METHOD OF USING A SPECIMEN SENSING END EFFECTOR TO DETERMINE THE THICKNESS OF A SPECIMEN

(75) Inventors: Paul Bacchi, Novato; Paul S. Filipski, Greenbrae, both of CA (US)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 09/920,353

(22) Filed: Aug. 1, 2001

Related U.S. Application Data

(60) Division of application No. 09/312,343, filed on May 14, 1999, now Pat. No. 6,275,748, which is a continuation-in-part of application No. 09/204,747, filed on Dec. 2, 1998, now Pat. No. 6,256,555.

(51) Int. Cl.[7] .............................................. G06F 19/00
(52) U.S. Cl. ...................... 700/275; 700/245; 700/248; 700/249; 700/250; 700/258; 700/260; 414/417; 414/941; 74/490.03; 701/23
(58) Field of Search ................................ 700/275, 245, 700/248, 249, 250, 258, 260; 414/417, 941; 74/490.03; 701/23

(56) References Cited

U.S. PATENT DOCUMENTS

| | | | | |
|---|---|---|---|---|
| 2,367,991 A | | 1/1945 | Bailey | 294/34 |
| 3,439,792 A | * | 4/1969 | Frank et al. | 198/394 |
| 3,865,254 A | * | 2/1975 | Johannsmeier | 198/394 |
| 3,930,684 A | * | 1/1976 | Lasch et al. | 198/380 |
| 3,982,627 A | * | 9/1976 | Isohata | 198/380 |
| 4,024,944 A | * | 5/1977 | Adams et al. | 198/394 |
| 4,410,209 A | | 10/1983 | Trapani | 294/34 |
| 4,452,480 A | | 6/1984 | Maier et al. | 394/104 |

(List continued on next page.)

FOREIGN PATENT DOCUMENTS

| | | | |
|---|---|---|---|
| EP | 0669642 | 8/1995 | H01L/21/00 |
| EP | 0820091 | 1/1998 | H01L/21/00 |
| WO | WO 9419821 | 9/1994 | H01L/21/00 |
| WO | WO 9744816 | 11/1997 | H01L/21/00 |
| WO | 9745861 | 12/1997 | H01L/21/00 |
| WO | WO 0003418 | 1/2000 | H01L/21/00 |

OTHER PUBLICATIONS

Brett et al., A tactile sensing technique for automatic gripping of compact shaped non–rigid materials, 1994, IEEE, pp. 5/1–5/5.*

Arai et al., Micro endeffector with micro pyramids adn intergrated piezoresistive for sensor, 1996, IEEE, pp. 842–849.*

Mahalingam et al., Special challenges of robotic gripping in space, 1988, IEEE, pp. 581–586.*

Song et al., Intelligent Rehabilitation Robotic System For The Disabled And The Elderly, IEEE., pp. 2682–2685 (1998).

Hesselroth et al., Neural Network Control of a Pneumatic Robot Arm, IEEE., pp. 28–38 (1994).

*Primary Examiner*—William A. Cuchlinski, Jr.
*Assistant Examiner*—McDieunel Marc
(74) *Attorney, Agent, or Firm*—Stoel Rives LLP

(57) ABSTRACT

Robot arm (16) end effectors,(10, 110, 210) rapidly and cleanly transfer semiconductor wafers (12) between a wafer cassette (14) and a processing station. The end effectors include fiber optic light transmission sensors (90, 102, 202, 214) for determining various wafer surface, edge, thickness, tilt, and location parameters. The sensors provide robot arm extension and elevation positioning data supporting methods of rapidly and accurately placing and retrieving a wafer from among a stack of closely spaced wafers stored in the wafer cassette. The methods effectively prevent accidental contact between the end effector and the wafers while effecting clean, secure gripping of the wafer.

8 Claims, 13 Drawing Sheets

U.S. PATENT DOCUMENTS

| | | | |
|---|---|---|---|
| 4,662,811 A | 5/1987 | Hayden | 414/433 |
| 4,693,028 A | 9/1987 | Olson | 294/34 |
| 4,717,190 A | 1/1988 | Witherspoon | 294/99.2 |
| 4,900,214 A | 2/1990 | Ben | 414/416 |
| 4,938,600 A | 7/1990 | Into | 365/401 |
| 5,092,729 A | 3/1992 | Yamazaki et al. | 414/225 |
| 5,238,354 A | 8/1993 | Volovich | 414/779 |
| 5,332,352 A | 7/1994 | Poduje et al. | 414/225 |
| 5,387,067 A | 2/1995 | Grunes | 414/217 |
| 5,456,561 A | 10/1995 | Poduje et al. | 414/225 |
| 5,511,934 A | 4/1996 | Bacchi et al. | 414/783 |
| 5,513,948 A | 5/1996 | Bacchi et al. | 414/783 |
| 5,538,385 A | 7/1996 | Bacchi et al. | 414/403 |
| 5,669,644 A | 9/1997 | Kaihotsu et al. | 294/1.1 |
| 5,697,759 A | 12/1997 | Bacchi et al. | 414/786 |
| 5,741,113 A | 4/1998 | Bacchi et al. | 74/744.5 |
| 5,765,444 A | 6/1998 | Bacchi et al. | 382/490.03 |
| 5,870,488 A | 2/1999 | Rush et al. | 382/151 |
| 5,944,476 A | 8/1999 | Bacchi et al. | 414/783 |
| 5,980,188 A | 11/1999 | Ko et al. | 414/417 |
| 6,098,484 A | 8/2000 | Bacchi et al. | 74/490.03 |
| 6,105,454 A | 8/2000 | Bacchi et al. | 74/490.03 |
| 6,275,748 B1 * | 8/2001 | Bacchi et al. | 414/941 |

* cited by examiner

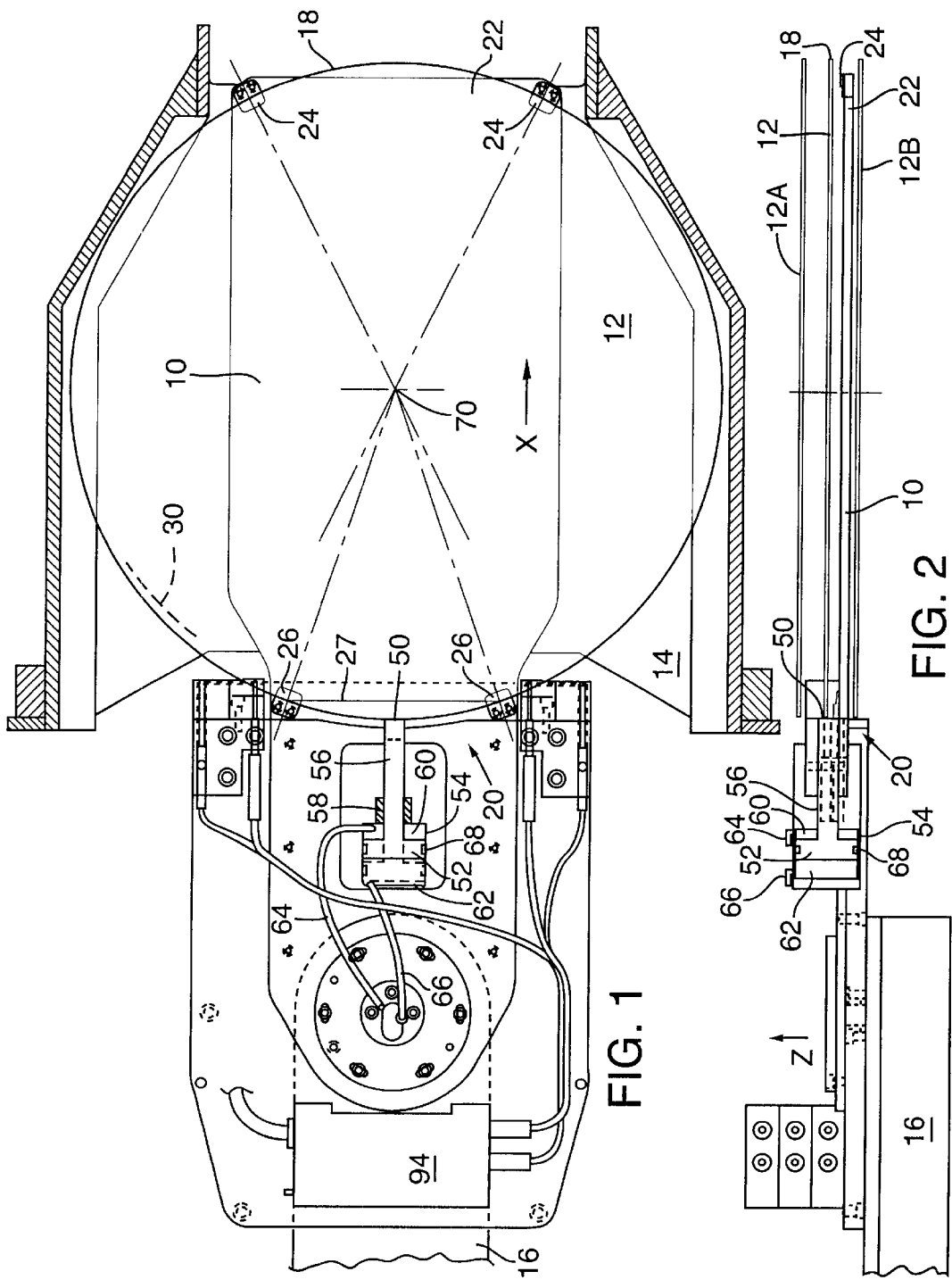

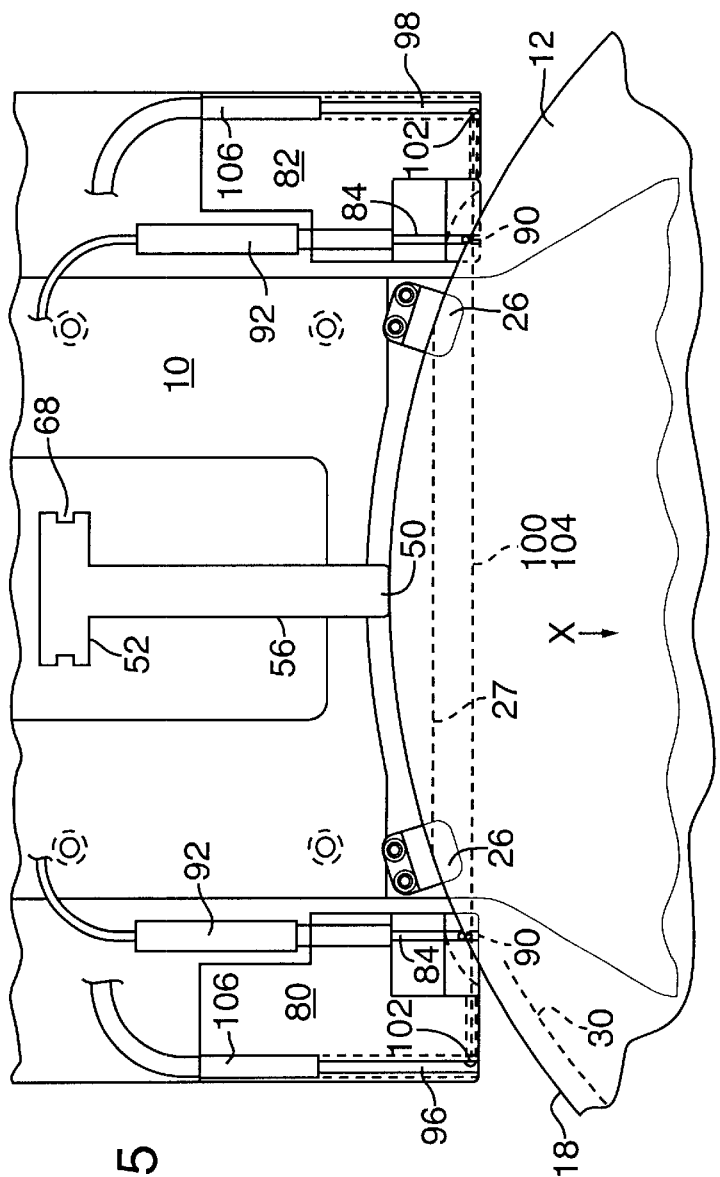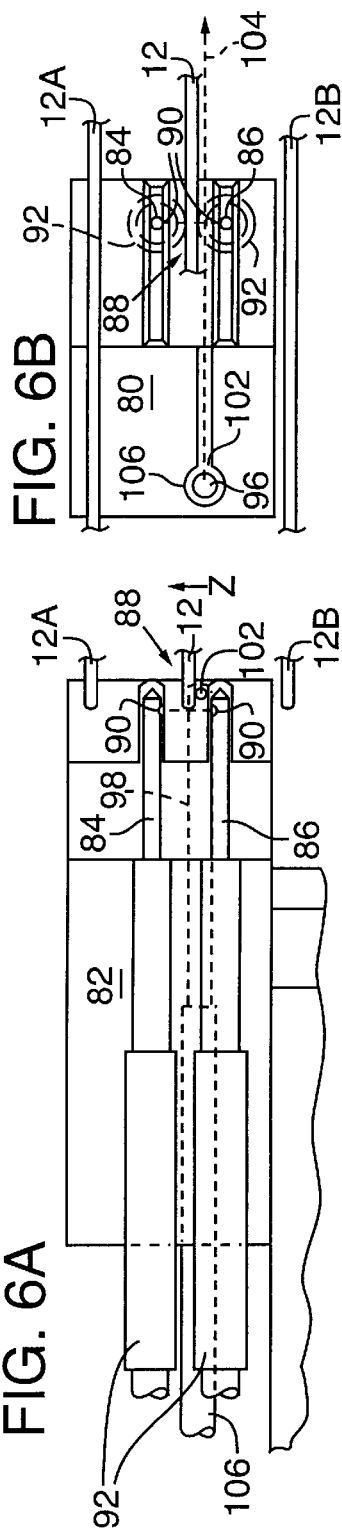

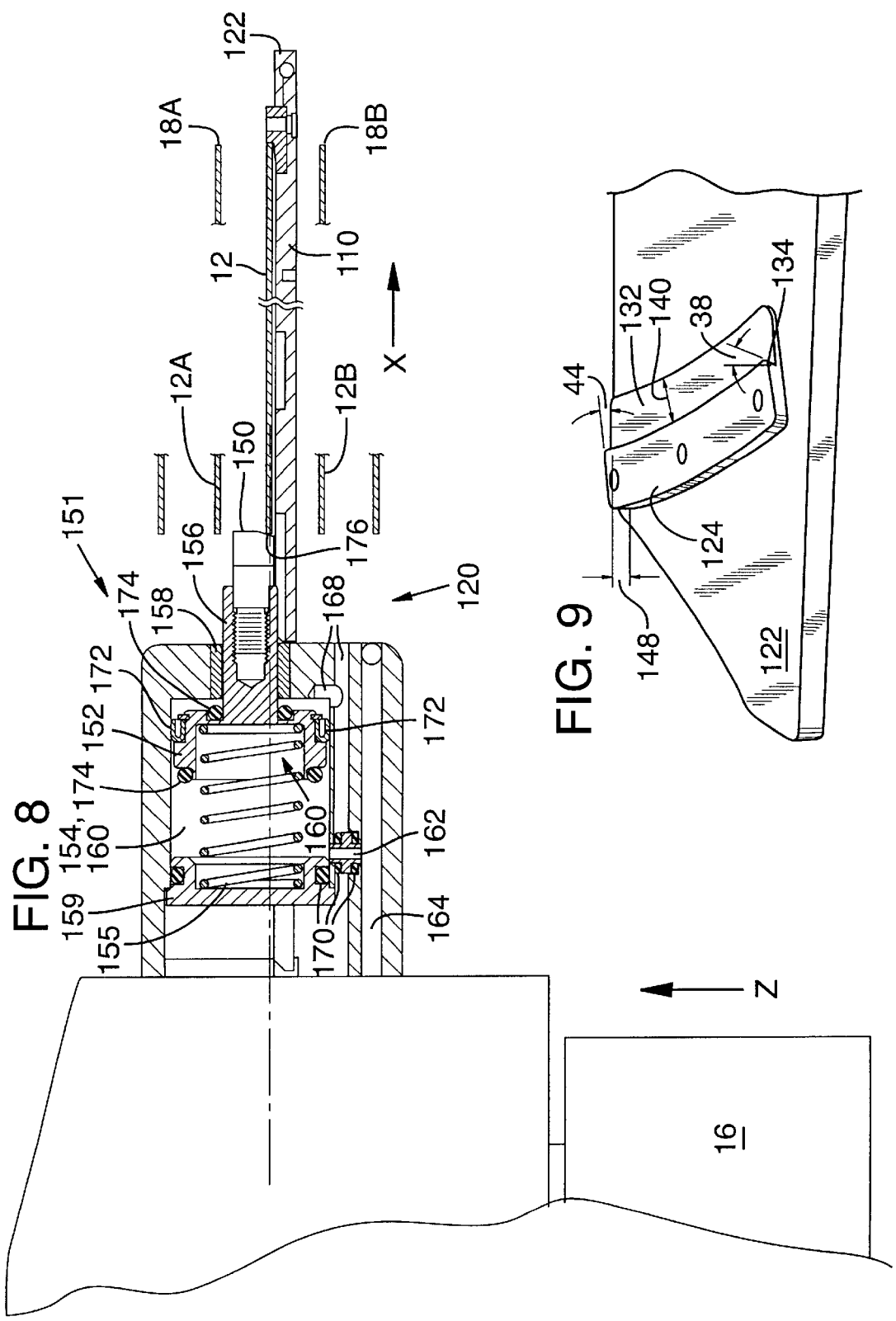

METHOD OF USING A SPECIMEN SENSING END EFFECTOR TO DETERMINE THE THICKNESS OF A SPECIMEN

RELATED APPLICATIONS

This application is a division of U.S. patent application Ser. No. 09/312,343, filed May 14, 1999, now U.S. Pat. No. 6,275,748, which is a continuation-in-part of U.S. patent application Ser. No. 09/204,747, filed Dec. 2, 1998, now U.S. Pat. No. 6,256,555.

FIELD OF THE INVENTION

This invention is directed to a specimen handling apparatus and method and, more particularly, to a method of using a semiconductor wafer robot arm end effector to determine the thickness of a semiconductor wafer stored in a container.

BACKGROUND OF THE INVENTION

Integrated circuits are produced from wafers of semiconductor material. The wafers are typically housed in a cassette having a plurality of closely spaced slots, each of which can contain a wafer. The cassette is typically moved to a processing station where the wafers are removed from the cassette, placed in a predetermined orientation by a prealigner or otherwise processed, and returned to another location for further processing.

Various types of wafer handling devices are known for transporting the wafers to and from the cassette and among processing stations. Many employ a robotic arm having a spatula-shaped end that is inserted into the cassette to remove or insert a wafer. The end of the robotic arm is referred to as an end effector that typically employs a vacuum to releasably hold the wafer to the end effector. The end effector typically enters the cassette through the narrow gap between a pair of adjacent wafers and engages the backside of a wafer to retrieve it from the cassette. The end effector must be thin, rigid, and positionable with high accuracy to fit between and not touch the closely spaced apart wafers in the cassette. After the wafer has been processed, the robotic arm inserts the wafer back into the cassette.

Unfortunately, transferring the wafer among the cassette, robot arm, and processing stations, such as a prealigner, may cause backside damage to the wafer and contamination of the other wafers in the cassette because intentional engagement as well as inadvertent touching of the wafer may dislodge particles that can fall and settle onto the other wafers. Wafer backside damage can include scratches as well as metallic and organic contamination of the wafer material. Robotic arms and prealigners that employ a vacuum to grip the wafer can be designed to minimize backside damage and particle creation. Even the few particles created with vacuum pressure gripping or any other non-edge gripping method are sufficient to contaminate adjacent wafers housed in the cassette. Reducing such contamination is particularly important to maintaining wafer processing yields. Moreover, the wafer being transferred may be scratched or abraded on its backside, resulting in wafer processing damage.

What is needed, therefore, is a specimen gripping end effector that can securely, quickly, and accurately transfer semiconductor wafers while minimizing wafer scratching and particle contamination.

SUMMARY OF THE INVENTION

An object of this invention is, therefore, to provide a specimen handling device that minimizes specimen damage and the production of contaminate particles.

Another object of this invention is to provide a semiconductor wafer handling device that can quickly and accurately transfer semiconductor wafers between a wafer cassette and a wafer processing station.

A further object of this invention is to provide a wafer handling device that can be retrofit to existing robot arm systems.

Robot arm end effectors of this invention rapidly and cleanly transfer semiconductor wafers between a wafer cassette and a processing station. The end effectors include at least one proximal rest pad and at least two distal rest pads having pad and backstop portions that support and grip the wafer within an annular exclusion zone that extends inward from the peripheral edge of the wafer. The end effectors also include an active contact point that is movable between a retracted wafer-loading position and an extended wafer-gripping position. The active contact point is movable to urge the wafer against the distal rest pads so that the wafer is gripped only at its edge or within the exclusion zone. The end effectors are configured so that wafer edge contact is achieved for end effectors with inclined rest pads. Optical sensors detect retracted, safe specimen loading/gripping, and extended positions of the active contact point.

The end effectors are generally spatula-shaped and have a proximal end that is operably connected to a robot arm. The active contact point is located at the proximal end, which allows the end effector to be lighter, stronger, and more slender than end effectors having moving mechanisms that may not fit between adjacent wafers in a cassette. The lack of moving mechanisms further causes the end effector to produce less contamination within the cassette. Additionally, locating the active contact point at the proximal end of the end effector ensures that it is remote from harsh conditions such as heated environments and liquids.

A vacuum pressure-actuated piston moves the active contact point between a retracted position, in which the wafer is loaded into the end effector, and an extended position in which the wafer is gripped. A first embodiment of the piston employs vacuum pressure to move the active contact point between extreme positions; a second embodiment of the piston employs vacuum pressure to retract the active contact point and a spring to extend the active contact point; and a third embodiment of the piston adds the above-mentioned optical sensors for detecting retracted, safe specimen loading/gripping, and extended positions of the active contact point.

Alternative embodiments of the end effector include flat or inclined, narrow or arcuate rest pads onto which the wafer is initially loaded. The narrow and arcuate inclined rest pad embodiments assist in centering and gripping the wafer between the active contact point and the distal rest pads. The arcuate rest pads more readily accommodate gripping and handling flatted wafers.

The end effectors further include fiber optic light transmission sensors for accurately locating the wafer edge and bottom surface. Three alternative embodiments include placing the wafer edge and bottom sensors at the proximal end of the end effector; placing the edge sensors at the proximal end and the bottom sensors at the distal end of the end effector; and placing a combined edge and bottom sensor at the distal end of the end effector. In all three embodiments, the sensors provide robot arm extension, elevation, and positioning data that support methods of rapidly and accurately placing a wafer on and retrieving a wafer from a wafer transport stage or a process chamber, and placing a wafer in and retrieving a wafer from among a stack of closely spaced wafers stored in a wafer cassette. The methods effectively prevent accidental contact between the end effector and adjacent wafers stacked in a cassette or a wafer resting on a processing device while effecting clean, secure gripping of the wafer.

Additional objects and advantages of this invention will be apparent from the following detailed description of preferred embodiments thereof which proceed with reference to the accompanying drawings.

BRIEF DESCRIPTION OF THE DRAWINGS

FIG. 1 is a plan view of a first embodiment of the end effector of this invention shown inserted into a semiconductor wafer cassette to retrieve or replace a wafer.

FIG. 2 is a side elevation view of the end effector of FIG. 1 without the wafer cassette but showing the end effector inserted between an adjacent pair of three closely spaced apart wafers as they would be stored in the cassette.

FIG. 5 is a fragmentary plan view of a portion of the end effector and wafer of FIG. 1, enlarged to reveal positional relationships among the wafer and a movable contact point, wafer rest pads, and wafer edge and elevation sensors of the first embodiment end effector of this invention.

FIGS. 6A and 6B are respective side and front elevation views of one of the edge and elevation sensors of FIG. 5, further enlarged to reveal the positioning of fiber optic light paths relative to the wafer.

FIG. 8 is a sectional side elevation view of the end effector of FIG. 7 showing an active contact point actuating mechanism gripping a wafer between adjacent ones of closely spaced apart wafers as they would be stored in the wafer cassette.

FIG. 9 is an enlarged isometric view of a distal arcuate rest pad embodiment of this invention mounted on the distal end of the end effector of FIG. 7.

DETAILED DESCRIPTION OF PREFERRED EMBODIMENTS

Figure 3:
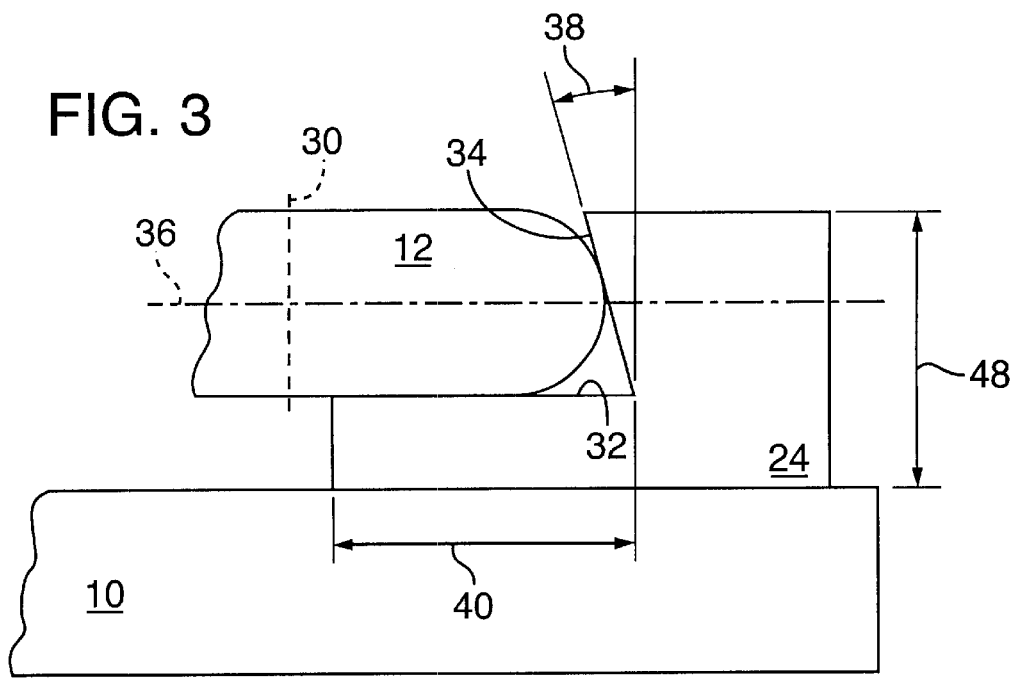
FIG. 3 is an enlarged side elevation view of a flat rest pad embodiment of this invention showing the rest pad engaging an exclusion zone of a wafer.

FIGS. 1 and 2 show a first embodiment of a spatula-shaped end effector 10 of this invention for transferring semiconductor wafers, such as a wafer 12 (shown transparent to reveal underlying structures), to and from a wafer cassette 14. End effector 10 is adapted to receive and securely hold wafer 12 and transfer it to and from cassette 14 for processing. FIG. 2 shows that end effector 10 is particularly adapted for retrieving and replacing wafer 12 from among closely spaced wafers, such as wafers 12, 12A, and 12B, which are shown as they might be stacked in wafer cassette 14. Wafers having diameters of less than 150 mm are typically spaced apart at a 4.76 mm (3/16 inch) pitch distance; 200 mm diameter wafers are typically spaced apart at a 6.35 mm (1/4 inch) pitch distance; and 300 mm wafers are typically spaced apart at a 10 mm (0.394 inch) pitch distance.

End effector 10 is operably attached to a robot arm 16 (a portion of which is shown) that is programmably positionable in a well known manner. In general, end effector 10 enters wafer cassette 14 to retrieve wafer 12 positioned between wafers 12A and 12B. End effector 10 is then finely positioned by robot arm 16 and actuated to grip a periphery 18 of wafer 12, remove wafer 12 from cassette 14, and transfer wafer 12 to a processing station (not shown) for processing. End effector 10 may then, if necessary, reinsert wafer 12 into cassette 14, release wafer 12, and withdraw from cassette 14.

End effector 10 is operably coupled to robot arm 16 at a proximal end 20 and extends to a distal end 22. End effector 10 receives wafer 12 between proximal end 20 and distal end 22 and includes at least two and, preferably, four rest pads upon which wafer 12 is initially loaded. Two distal rest pads 24 are located at, or adjacent to, distal end 22 of end effector 10; and at least one, but preferably two proximal rest pads 26 are located toward proximal end 20. Distal rest pads 24 may alternatively be formed as a single arcuate rest pad having an angular extent greater than the length of a "flat," which is a crystal structure-indicating feature commonly found on semiconductor wafers. A flat 27 is shown, by way of example only, positioned between proximal rest pads 26. Of course, wafer 12 may have a different orientation, so periphery 18 is also shown positioned between proximal rest pads 26.

Wafer 12 includes an exclusion zone 30 (a portion of which is shown in dashed lines). Semiconductor wafers have an annular exclusion zone, or inactive portion, that extends inwardly about 1 mm to about 5 mm from periphery 18 and completely surrounding wafer 12. Exclusion zone 30 is described as part of an industry standard wafer edge profile template in SEMI (Semiconductor Equipment and Materials International) specification M10298, pages 18 and 19. As a general rule, no part of end effector 10 may contact wafer 12 beyond the inner boundary of exclusion zone 30. It is anticipated that future versions of the specification may allow edge contact only, a requirement that is readily accommodated by this invention.

The distance between rest pads 24 and the distance between rest pads 26 each have an angular extent greater than any feature on wafer 12 to guarantee that wafer 12 is gripped only within exclusion zone 30. Rest pads 24 and 26 may be made of various materials, but a preferred material is polyetheretherketone ("peek"), which is a semi-crystalline high temperature thermoplastic manufactured by Victrex in the United Kingdom. The rest pad material may be changed to adapt to different working environments, such as in high temperature applications.

FIG. 3 shows a substantially flat embodiment of distal rest pads 24. This embodiment can be advantageously, but need not exclusively be, used with wafers having less than about a 200 mm diameter. Distal rest pads 24 include a pad portion 32 and a backstop portion 34. In the flat embodiment, pad portion 32 is substantially parallel to an imaginary plane 36 extending through wafer 12, and backstop portion 34 is inclined toward wafer 12 at a backstop angle 38 of up to about 5 degrees relative to a line perpendicular to plane 36. Alternatively, pad portion 32 may be inclined away from wafer 12 up to about 3 degrees relative to plane 36. Pad portion 32 has a length 40 that is a function of the depth of exclusion zone 30, but is preferably about 3 mm long. Wafer 12 typically has a substantially rounded peripheral edge and contacts rest pads 24 only within exclusion zone 30. Wafer 12 is gripped by urging it into the included: angle formed between pad portion 32 and backstop portion 34.

Figure 4:
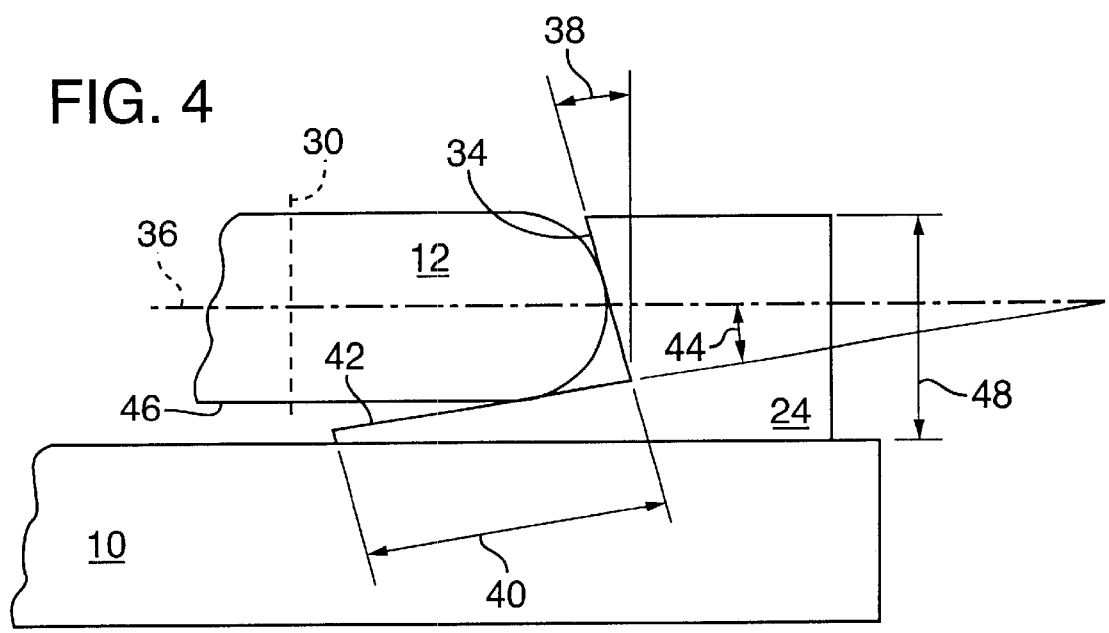
FIG. 4 is an enlarged side elevation view of an inclined rest pad embodiment of this invention showing the inclined rest pad engaging substantially a periphery of a wafer.

FIG. 4 shows an inclined embodiment of distal rest pads 24. This embodiment can be advantageously, but need not exclusively be, used with wafers having greater than about a 200 mm diameter. Distal rest pads 24 include an inclined pad portion 42 and a backstop portion 34. In the inclined embodiment, inclined pad portion 42 is inclined away from wafer 12 at a rest pad angle 44 of about 3 degrees relative to plane 36, and backstop portion 34 is inclined toward wafer 12 at backstop angle 38 of up to about 3 degrees. Inclined pad portion 42 has a length 40 that is a function of the depth of exclusion zone 30, but is preferably about 3 mm long. As before, wafer 12 typically has a substantially rounded peripheral edge and contacts rest pads 24 only within exclusion zone 30. Wafer 12 is gripped by urging it into the included angle formed between pad portion 42 and backstop portion 34. In the inclined embodiment, there is substantially no contact between rest pad 24 and a bottom surface 46 of wafer 12. This rest pad embodiment is also suitable for wafer edge contact only.

Both the flat and inclined embodiments of distal rest pads 24 have a height 48 that substantially reaches but does not extend beyond the top surface of wafer 12.

Referring again to FIG. 1, proximal rest pads 26 are similar to distal rest pads 24 except that each rest pad 26 does not necessarily require a backstop portion and its pad portion has a length of about twice that of length 40.

End effector 10 further includes an active contact point 50 that is located at proximal end 20 of end effector 10 and between proximal rest pads 26. Active contact point 50 is movable between a retracted wafer-loading position (shown in dashed lines) and an extended wafer-gripping position (shown in solid lines).

Active contact point 50 is operatively connected to a piston 52 for reciprocation between the retracted and extended positions. In a first embodiment, piston 52 reciprocates within a bore 54 and is preferably vacuum pressure operated to extend and retract active contact point 50. Active contact point 50 is connected to piston 52 by a piston rod 56 that extends through an airtight seal 58. Bore 54 forms a vacuum chamber in end effector 10 that is divided by piston 52 into a drive chamber 60 and a return chamber 62. Drive chamber 60 is in pneumatic communication with a vacuum pressure source (not shown) through a first channel 64, and return chamber 62 is in pneumatic communication with the vacuum pressure source through a second channel 66. The vacuum pressure acts through drive chamber 60 against the front face of piston 52 to extend active contact point 50 to the wafer-gripping position and acts through return chamber 62 against the back face of piston 52 to retract active contact point 50 as controlled by the programmable control. The vacuum pressure source is routed to first and second channels 64 and 66 through rotary vacuum communication spools in robot arm 16. Preferred rotary vacuum communication spools are described in U.S. Pat. No. 5,741,113 for CONTINUOUSLY ROTATABLE MULTIPLE LINK ROBOT ARM MECHANISM, which is assigned to the assignee of this application.

Piston 52 further includes an annular groove 68 that is in pneumatic communication with a vent (not shown) in piston rod 56. First and second channels 64 and 66 are connected to, respectively, drive chamber 60 and return chamber 62 at locations that are opened to groove 68 at the travel limits of piston 52. Therefore, vacuum pressure in first and second channels 64 and 66 is reduced at the travel limits of piston 52, thereby providing signals to the vacuum controller that active contact point 50 is fully extended or retracted to effect proper loading of wafer 12.

After wafer 12 is loaded onto end effector 10, active contact point 50 is actuated to move wafer 12 into its gripped position. As active contact point 50 is extended, it urges wafer 12 toward distal rest pads 24 until wafer 12 is gripped within exclusion zone 30 by active contact point 50 and distal rest pads 24.

Proximal rest pads 26 are arranged relative to distal rest pads 24 so that plane 36 of wafer 12 is preferably parallel to end effector 10 when gripped. This arrangement is readily achieved when the flat embodiment of proximal and distal rest pads 24 and 26 is employed. However, when the inclined embodiment is employed, proximal and distal rest pads 24 and 26 are arranged such that the points where wafer 12 contacts pad portions 42 are substantially equidistant from a center 70 of wafer 12 when active contact point 50 is extended and wafer 12 is gripped. For example, when wafer 12 is in the position shown in FIG. 1, the pad portions of distal and proximal rest pads 24 and 26 contact wafer 12 at points tangent to periphery 18 such that a line through the center of each pad portion 42 intersects center 70 of wafer 12.

The location of active contact point 50 at proximal end 20 allows end effector 10 to be lighter, stronger, and more slender than end effectors having moving mechanisms that may not fit between adjacent wafers 12, 12A, and 12B in cassette 14. The lack of moving mechanisms further causes end effector 10 to produce less contamination within cassette 14. Additionally, locating active contact point 50 at proximal end 20 of end effector 10 ensures that active contact point 50 is remote from harsh conditions such as heated environments and liquids.

The close spacing of adjacent wafers 12, 12A, and 12B requires accurate positioning of end effector 10 to enter cassette 14 and positively grip the wafers without touching adjacent wafers.

FIGS. 5, 6A, and 6B show respective top, side, and front views of a first embodiment of wafer edge and elevation sensors that provide accurate wafer 12 positioning data relative to end effector 10. (Wafer 12 is shown transparent to reveal underlying structures.) The sensors are housed in first and second sensor housings 80 and 82, which together form three light transmission sensors, each having a fiber optic source/receiver pair.

Two wafer edge sensors are implemented as follows. First and second sensor housings 80 and 82 each include a light source fiber 84 and a light receiver fiber 86 that form between them a small U-shaped opening 88 into which periphery 18 of wafer 12 can fit. Fibers 84 and 86 further include mutually facing light path openings 90 that form a narrow light transmission pathway for detecting the presence or absence of periphery 18 of wafer 12. Fibers 84 and 86 extend through ferrules 92 to a light source/receiver module 94 that is mounted on a convenient location of end effector 10 near its rotary connection to robot arm 16. Light source/receiver module 94 conventionally detects degrees of light transmission between fibers 84 and 86 and, thereby, accurately senses the positioning of periphery 18 between light path openings 90. Of course, the relative positions of fibers 84 and 86 may be reversed.

One elevation sensor is implemented as follows. First sensor housing 80 further includes a light source fiber 96 (shown in phantom), and second sensor housing 82 includes a light receiver fiber 98 (shown in phantom). Fibers 96 and 98 form between them a wide opening that sights along a bottom surface chord 100 of wafer 12. Fibers 96 and 98 further include mutually facing light path openings 102 that form a narrow light transmission pathway 104 for detecting the presence or absence of bottom surface chord 100 of wafer 12. Fibers 96 and 98 extend through ferrules 106 to light source/receiver module 94. Light source/receiver module 94 conventionally detects degrees of light transmission between fibers 96 and 98 and thereby accurately senses the positioning of bottom surface chord 100 between light path openings 102. Of course, the relative positions of fibers 96 and 98 may be reversed.

Flat 27 may be detected by separating light path openings 102 from each other by distance greater than the length of flat 27. Flat 27 is present if bottom surface chord 100 is sensed between light path openings 102, but periphery 18 is not sensed between one of the pairs of light path openings 90.

The procedure by which end effector 10 accesses wafer 12 of a known diameter, such as 200 mm, is described below with reference to FIGS. 2, 5, 6A, and 6B.

Active contact point 50 is placed in its retracted position.

End effector 10 is inserted in an X direction into cassette 14 between, for example, wafers 12 and 12B, until periphery 18 is sensed between at least one pair of light path openings 90.

A controller (not shown) associated with robot arm 16 records the extension of robot arm 16 when periphery 18 is sensed, ignoring any sensed flat.

End effector 10 is retracted in the −X direction by an amount sufficient to provide clearance between wafer 12 and the edge detectors.

Robot arm 16 is moved in a Z direction until bottom surface chord 100 of wafer 12 is sensed.

The controller records the Z elevation of the bottom surface of wafer 12.

The controller computes the X distance required to reach into cassette 14 at a Z elevation below the bottom surface of wafer 12 so distal and proximal rest pads 24 and 26 clear wafers 12 and 12B.

The controller also accounts for:
1) a radial distance offset and an elevation distance offset of distal rest pads 24 relative to the Z elevation of light transmission pathway 104, and
2) the radial distance end effector 10 was retracted after sensing periphery 18.

The controller moves end effector 10 in the X direction into cassette 14 and elevates in the Z direction to contact wafer 12 on landing pads 24 and 26.

Active contact point 50 is actuated to urge wafer 12 into the included angle between pad and backstop portions 32 and 34 of distal rest pads 24, thereby gripping wafer 12.

End effector 10 withdraws wafer 12 in the −X direction from cassette 14.

Figure 7:
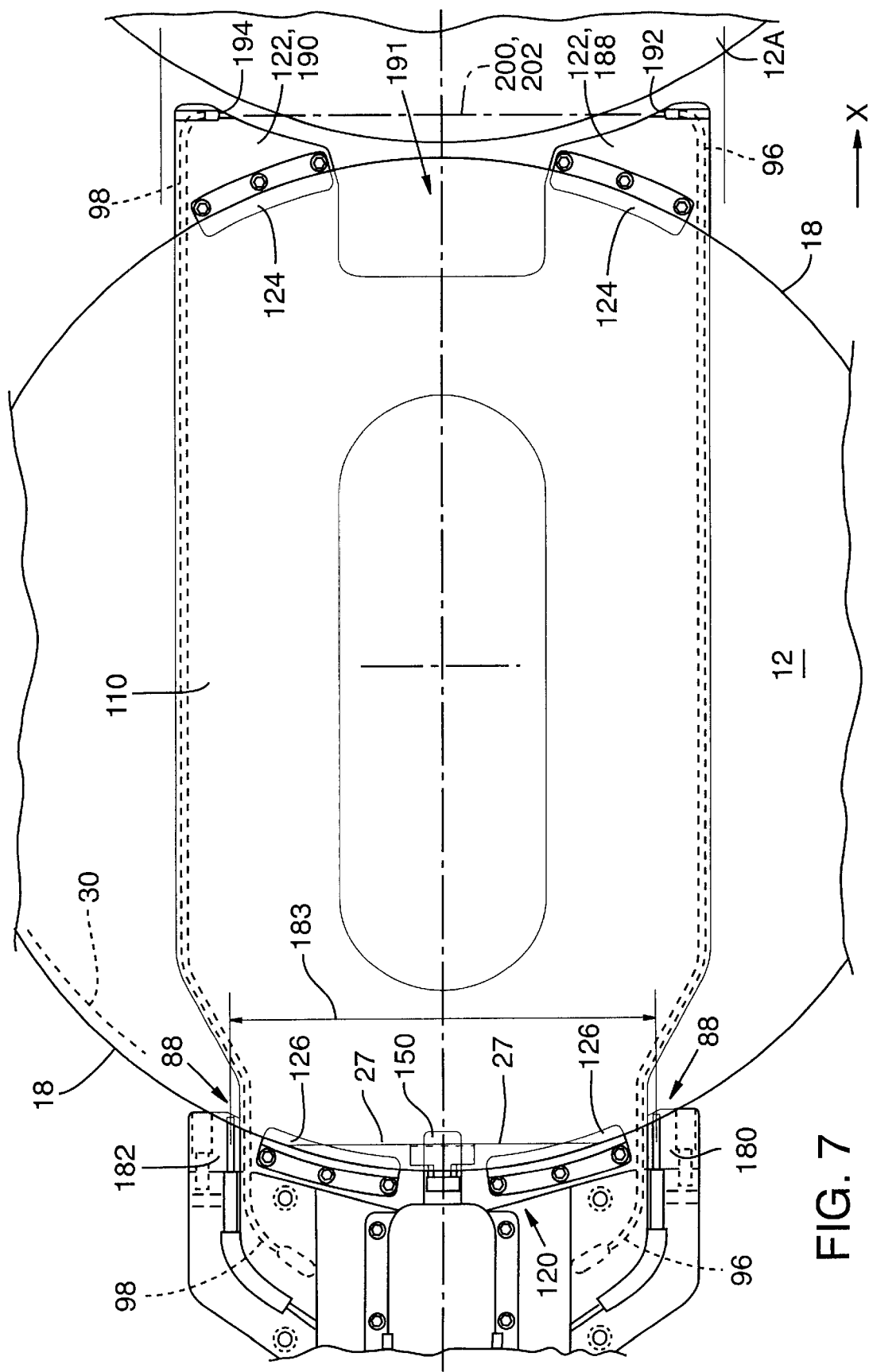
FIG. 7 is a plan view of a second embodiment of the end effector of this invention shown gripping a semiconductor wafer and adjacent to a semiconductor wafer in a wafer cassette to sense, retrieve, or replace a wafer.

FIGS. 7 and 8 show a second embodiment of a spatula-shaped end effector 110 of this invention for transferring semiconductor wafers, such as wafer 12 (shown transparent to reveal underlying structures), to and from wafer cassette 14 (not shown in this view). End effector 110 is similar to end effector 10 but is further adapted to sense the bottom surface of a wafer stored in wafer cassette 14 without protruding into the cassette. FIG. 8 shows that end effector 110 is particularly adapted for retrieving and replacing wafer 12 from among closely spaced apart wafers, such as wafers 12, 12A, and 12B, which are shown as they might be stacked in wafer cassette 14.

End effector 110 is operably attached to robot arm 16. In general, end effector 110 senses the bottom surface of wafer 12 before entering wafer cassette 14 to retrieve wafer 12 from between wafers 12A and 12B. End effector 110 is then finely positioned by robot arm 16 and actuated to grip periphery 18 of wafer 12, remove wafer 12 from cassette 14, and transfer wafer 12 to a processing station (not shown) for processing. End effector 110 may then, if necessary, reinsert wafer 12 into cassette 14, release wafer 12, and withdraw from cassette 14.

End effector 110 is operably coupled to robot arm 16 at a proximal end 120 and extends to a distal end 122. End effector 110 receives wafer 12 between proximal end 120 and distal end 122 and preferable includes at least two and, more preferably, four arcuate rest pads upon which wafer 12 is initially loaded. Two distal arcuate rest pads 124 are located at, or adjacent to, distal end 122 of end effector 110; and at least one, but preferably two proximal arcuate rest pads 126 are located toward proximal end 120. Distal and proximal arcuate rest pads 124 and 126 may have an angular extent greater than flat 27, which is shown, by way of example only, positioned between proximal rest pads 126. Of course, wafer 12 may have a different orientation from that shown.

Arcuate rest pads 124 and 126, whether separated as shown, or joined into a single rest pad, have an angular extent greater than any feature on wafer 12 to guarantee that wafer 12 is sufficiently gripped, whether flatted or not, and only within exclusion zone 30. Like rest pads 24 and 26, rest pads 124 and 126 may be made of various materials, but the preferred material is peek.

FIG. 9 shows the embodiment of distal arcuate rest pads 124 that is suitable for use with flatted or nonflatted wafers. Distal arcuate rest pads 124 include an inclined pad portion 132 and a backstop portion 134. Referring also to FIG. 4, inclined pad portion 132 is inclined away from wafer 12 at rest pad angle 44 of about 3 degrees relative to plane 36, and backstop portion 134 is inclined toward wafer 12 at backstop angle 38 of up to about 3 degrees. Inclined pad portion 132 has a length 140 that is a function of the depth of exclusion zone 30, but is preferably about 3 mm long. As before, wafer 12 typically has a substantially rounded peripheral edge and contacts arcuate rest pads 124 by wafer edge contact (and perforce only within exclusion zone 30). Of course, the peripheral edge need not be rounded. Wafer 12 is gripped by urging it into the included angle formed between inclined pad portion 132 and backstop portion 134.

Distal arcuate rest pads 124 have a height 148 that substantially reaches but does not extend beyond the top surface of wafer 12.

Referring again to FIG. 7, proximal arcuate rest pads 126 are similar to distal arcuate rest pads 124 except that each rest pad 126 does not necessarily require a backstop portion and its pad portion has a length of about twice that of length 140.

End effector 110 further includes an active contact point 150 that is located at proximal end 120 of end effector 110 and between proximal arcuate rest pads 126. Active contact point 150 is movable between a retracted wafer-loading position (not shown) and the extended wafer-gripping position shown.

Referring again to FIG. 8, a second embodiment of an active contact point actuating mechanism 151 is shown employed with end effector 110. Active contact point 150 is operatively connected to a piston 152 for reciprocation between retracted and extended positions. In this embodiment, piston 152 reciprocates within a bore 154 and is urged by a spring 155 to extend active contact point 150 and by a vacuum pressure to retract active contact point 156. Active contact point 150 is connected to piston 152 by a piston rod 156 that extends through an annular airtight seal 158. Bore 154 includes an end cap 159 that forms one wall of a vacuum chamber 160, the other wall of which is movably formed by piston 152. Vacuum chamber 160 is in pneumatic communication with a vacuum pressure source (not shown) through a vacuum feedthrough 162 and a vacuum channel 164. Spring 155 presses against the face of piston 152 to extend active contact point 150 to the wafer-gripping position, whereas the vacuum pressure acts through vacuum chamber 160 against the face of piston 152 to overcome the spring force and retract active contact point 150 to the wafer-releasing position.

In the second embodiment, active contact point 150 is urged against wafer 12 with a force determined solely by spring 155. Spring 155 is supported between recesses 166 in piston 152 and end cap 159. The vacuum pressure source is routed to vacuum channel 164 through rotary vacuum communication seals or spools in robot arm 16.

Actuating mechanism 151 further includes a vent 168 in pneumatic communication with the atmosphere to allow free movement of piston 152 within the portion of bore 154 not in pneumatic communication with the vacuum pressure source. Actuating mechanism 151 is made "vacuum tight" by O-ring seals 170 surrounding end cap 159 and vacuum feedthrough 162 and by an annular moving seal 172 surrounding piston 152. O-ring bumper seals 174 fitted to the faces of piston 152 absorb contact shocks potentially encountered by piston 152 at the extreme ends of its travel.

After wafer 12 is loaded onto end effector 110, active contact point 150 is actuated to move wafer 12 into its gripped position. As active contact point 150 is extended by spring 155, it urges wafer 12 toward distal arcuate rest pads 124 until wafer 12 is gripped by wafer edge contact (and perforce within exclusion zone 30) by active contact point 150 and distal arcuate rest pads 124. Active contact point 150 includes an inwardly inclined face portion 176 that urges wafer 12 toward proximal arcuate rest pads 126, thereby firmly gripping the peripheral edge of wafer 12.

Proximal arcuate rest pads 126 are arranged relative to distal arcuate rest pads 124 so that the plane of wafer 12 is preferably parallel to end effector 110 when gripped.

In a manner similar to end effector 10, the location of active contact point 150 at proximal end 120 allows end effector 110 to be lighter, stronger, and more slender than end effectors having moving mechanisms that may not fit between adjacent wafers 12, 12A, and 12B in cassette 14. The lack of moving mechanisms between its proximal and distal ends further causes end effector 110 to produce less contamination within cassette 14. Moreover, unlike end effector 10, which is actuated by two vacuum lines, end effector 110 requires only one vacuum line for actuation. Of course, end effector 10 could be fitted with actuating mechanism 151.

The close spacing of adjacent wafers 12, 12A, and 12B requires accurate positioning of end effector 110 to enter cassette 14 and positively grip the wafers without touching adjacent wafers.

Figure 10:
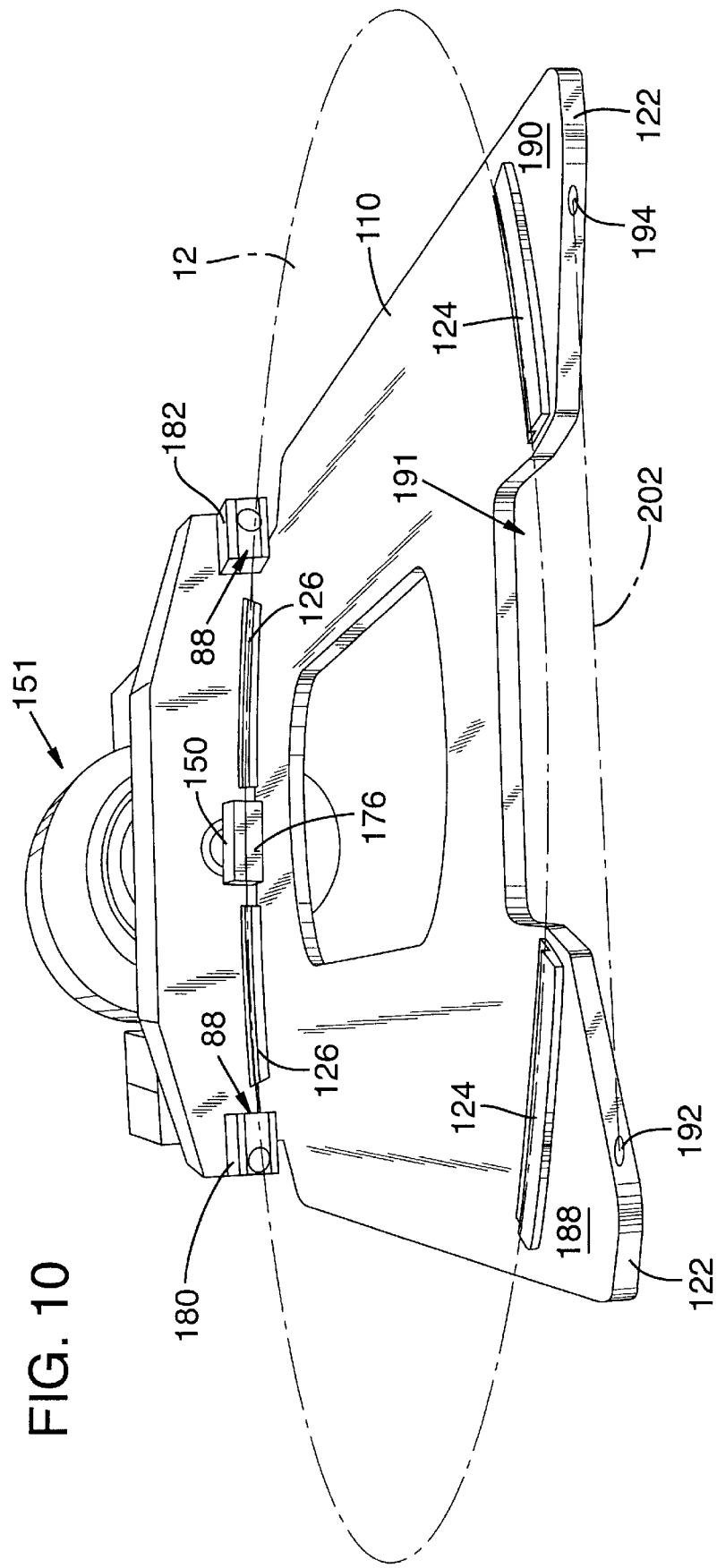
FIG. 10 is an end perspective view of the end effector of FIG. 7 showing positional relationships among the movable contact point, arcuate rest pads, and wafer edge and elevation sensors of the second embodiment end effector of this invention.
Figure 11:
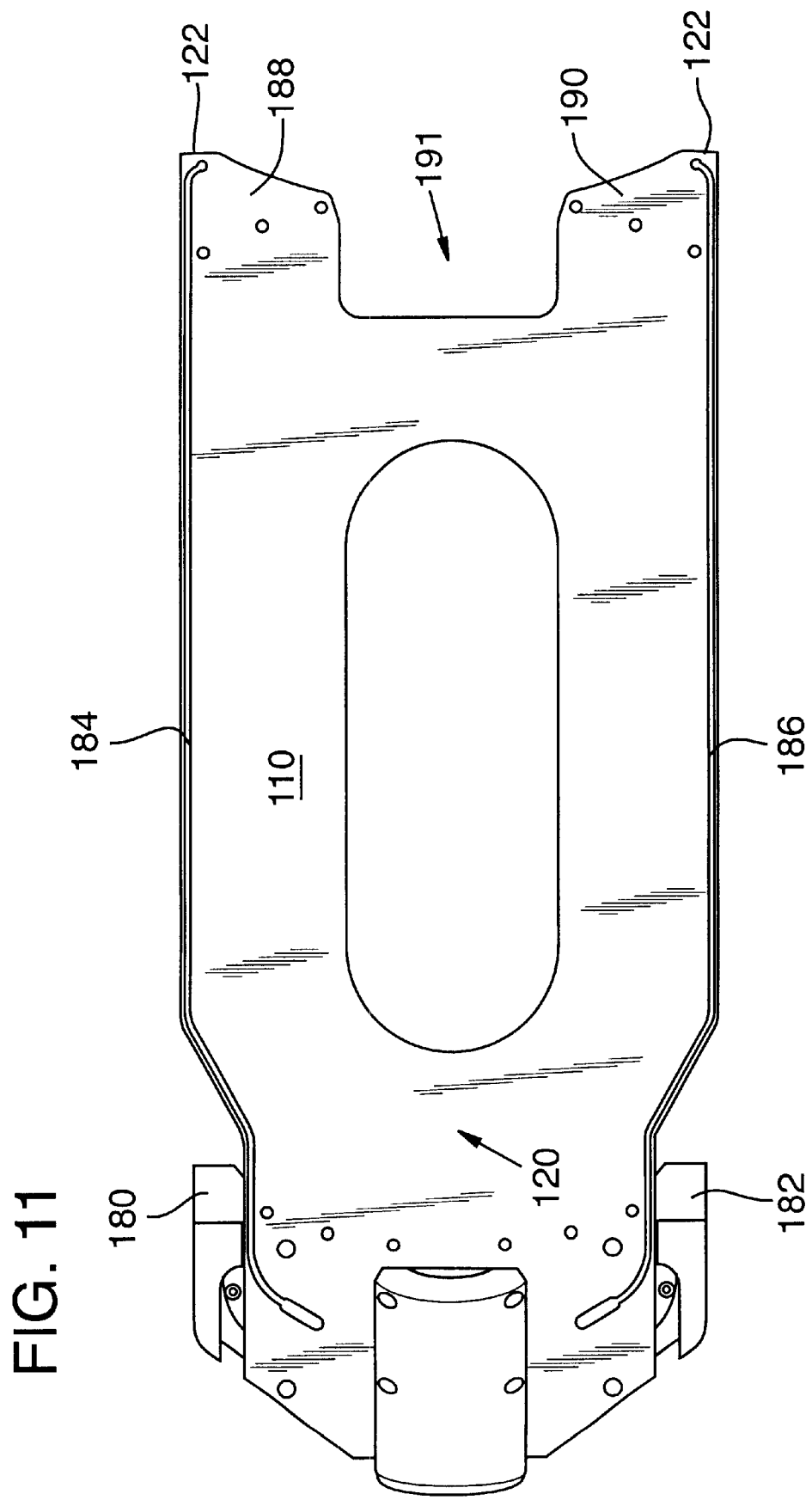
FIG. 11 is a bottom view of the end effector of FIG. 7 showing fiber optic routing channels for elevation sensors of the second embodiment end effector of this invention.

FIGS. 7, 10, and 11 show respective top, end, and bottom views of a second embodiment of wafer edge and elevation sensors that provide accurate wafer 12 positioning data relative to end effector 110. The wafer edge sensors are housed in first and second sensor housings 180 and 182, each having a fiber optic source/receiver pair forming a light transmission sensor in each housing. The elevation sensor is housed in distal end 122 of end effector 110.

Two wafer edge sensors are implemented as follows. First and second sensor housings 180 and 182 each include light source fiber 84 and light receiver fiber 86, as in end effector 10, that form between them a small U-shaped opening 88 into which periphery 18 of wafer 12 can fit. As before, fibers 84 and 86 include mutually facing light path openings that form a narrow light transmission pathway for detecting the presence or absence of periphery 18 of wafer 12. The two wafer edge sensors are separated from each other by a distance 183 greater than the length of flat 27 so that a flatted wafer can be detected when only one of the two wafer edge sensors detects periphery 18 of wafer 12. Of course, wafer 12 must be appropriately oriented in cassette 14 to detect flat 27.

The elevation sensor is implemented as follows. Unlike the first embodiment, first and second sensor housings 180 and 182 do not include light source fiber 96 and light receiver fiber 98. Rather in this embodiment, light source fiber 96 is routed through a first channel 184 formed in the bottom surface of end effector 110 and running between proximal end 120 and a first distal tine 188 proximal to distal end 122 of end effector 110. In like manner, light receiver fiber 98 is routed through a second channel 186 formed in the bottom surface of end effector 110 and running between proximal end 120 and a second distal tine 190 proximal to distal end 122 of end effector 110. Distal tines 188 and 190 are widely spaced apart across a gap 191 that forms a relief region for certain types of processing equipment, such as wafer prealigners.

Fibers 96 and 98 terminate in mutually facing light path openings 192 and 194 formed in distal tines 188 and 190. Fibers 96 and 98 form between them a wide opening that sights along a bottom surface chord 200 of, for example, wafer 12A. Mutually facing light path openings 192 and 194 form a narrow light transmission pathway 202 for detecting the presence or absence of bottom surface chord 200 of wafer 12A. In end effector 110, light transmission pathway 202 extends beyond the portion of distal end 122 that would first contact wafer 12, thereby further providing an obstruction sensing capability. As before, light source/receiver module 94 conventionally detects degrees of light transmission between fibers 96 and 98 and, thereby, accurately senses the positioning of bottom surface chord 200 between light path openings 192 and 194. Of course, the relative positions of fibers 96 and 98 may be reversed.

The procedure by which end effector 110 accesses a predetermined wafer from among closely spaced apart wafers in a cassette, is described below with reference to FIGS. 7, 8, and 10.

Active contact point 150 is placed in its retracted position.

End effector 110 is moved in an X direction toward cassette 14 until tines 188 and 190 are adjacent to, but not touching, a predicted position for any wafer 12 in cassette 14.

End effector 110 is then scanned in a Z direction such that light transmission pathway 202 intersects the bottom surface chord 200 of any wafer in cassette 14 and, additionally, detects any obstruction projecting from cassette 14 toward end effector 110.

The controller (not shown) records the Z elevations of the bottom surfaces of any wafers and obstructions detected.

Robot arm 16 is moved to a Z elevation calculated to access a predetermined wafer, such as wafer 12A, while also providing clearance for end effector 110 between adjacent wafers.

The following optional operations may be performed:

End effector 110 may be optionally moved in an X direction toward cassette 14 until tines 188 and 190 are adjacent to, but not touching, wafer 12A. In this position, light transmission pathway 202 should be adjacent to bottom surface chord 200 of wafer 12A;

robot arm 16 is optionally moved in a Z direction until bottom surface chord 200 of wafer 12A is sensed;

the controller optionally verifies the previously sensed Z elevation of the bottom surface of wafer 12A; and robot arm 16 is optionally moved in a −Z direction to provide clearance for end effector 110 between adjacent wafers.

End effector 110 is inserted in an X direction into cassette 14 between adjacent wafers until periphery 18 is sensed between at least one wafer edge sensor.

The controller moves end effector 10 in the Z direction calculated to contact wafer 12A on arcuate rest pads 124 and 126.

Active contact point 150 is actuated to urge wafer 12A into the included angle between pad and backstop portions 132 and 134 of distal arcuate rest pads 124, thereby gripping wafer 12A. (In FIG. 7, the gripped wafer is shown as wafer 12.)

End effector 110 withdraws wafer 12A in the −X direction from cassette 14.

End effector 110 combines a very thin Z-direction profile and accurate wafer position sensing to enable clean, rapid, and secure movement of very closely spaced apart wafers in a cassette.

Figure 12:
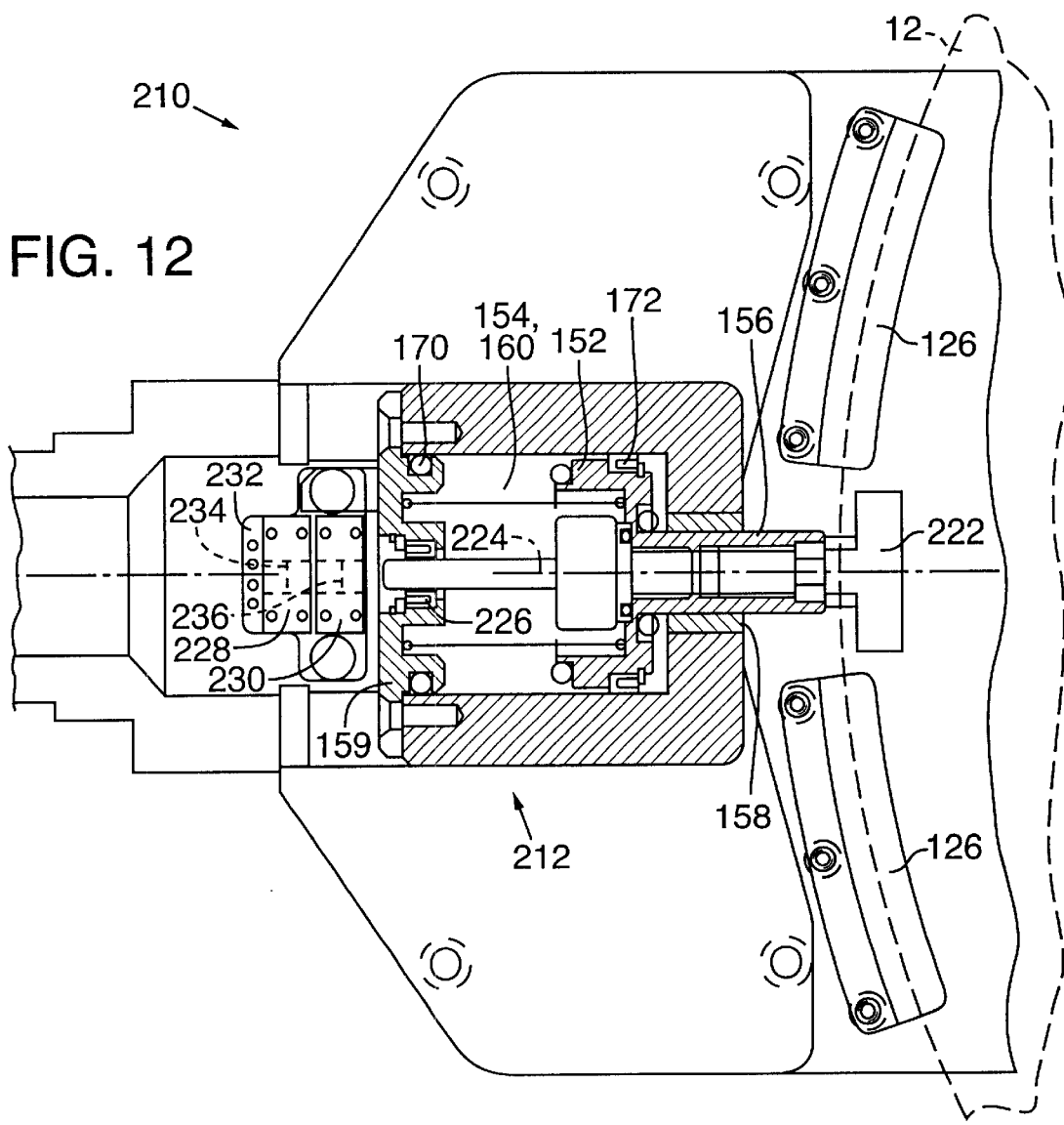
FIG. 12 is a fragmentary plan view of a portion of a third embodiment of an end effector of this invention, showing positional relationships among the wafer, a position sensing active contact point actuating mechanism, and the proximal rest pads.
Figure 13:
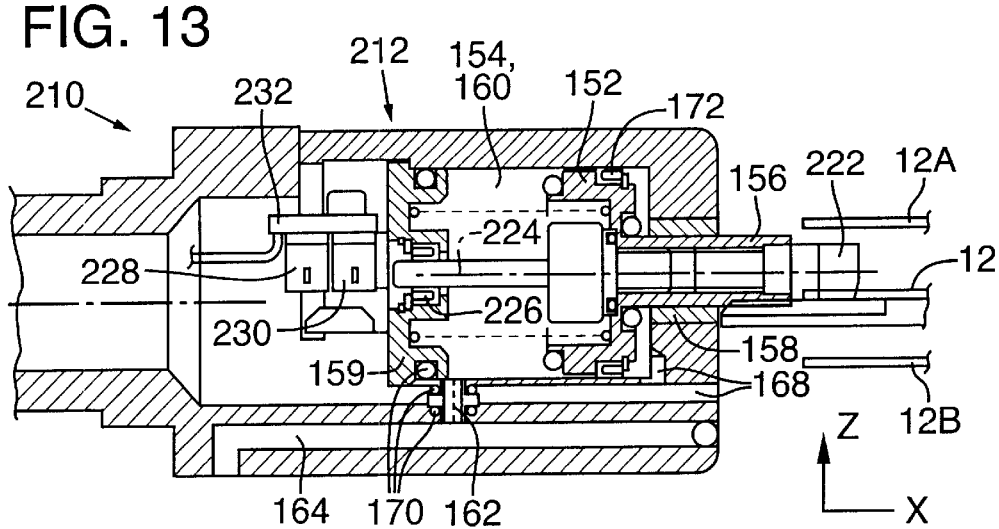
FIG. 13 is a sectional side elevation view of the end effector portion of FIG. 12 showing the position sensing active contact point actuating mechanism fully extended between adjacent closely spaced wafers as they would be stored in the wafer cassette.
Figure 14:
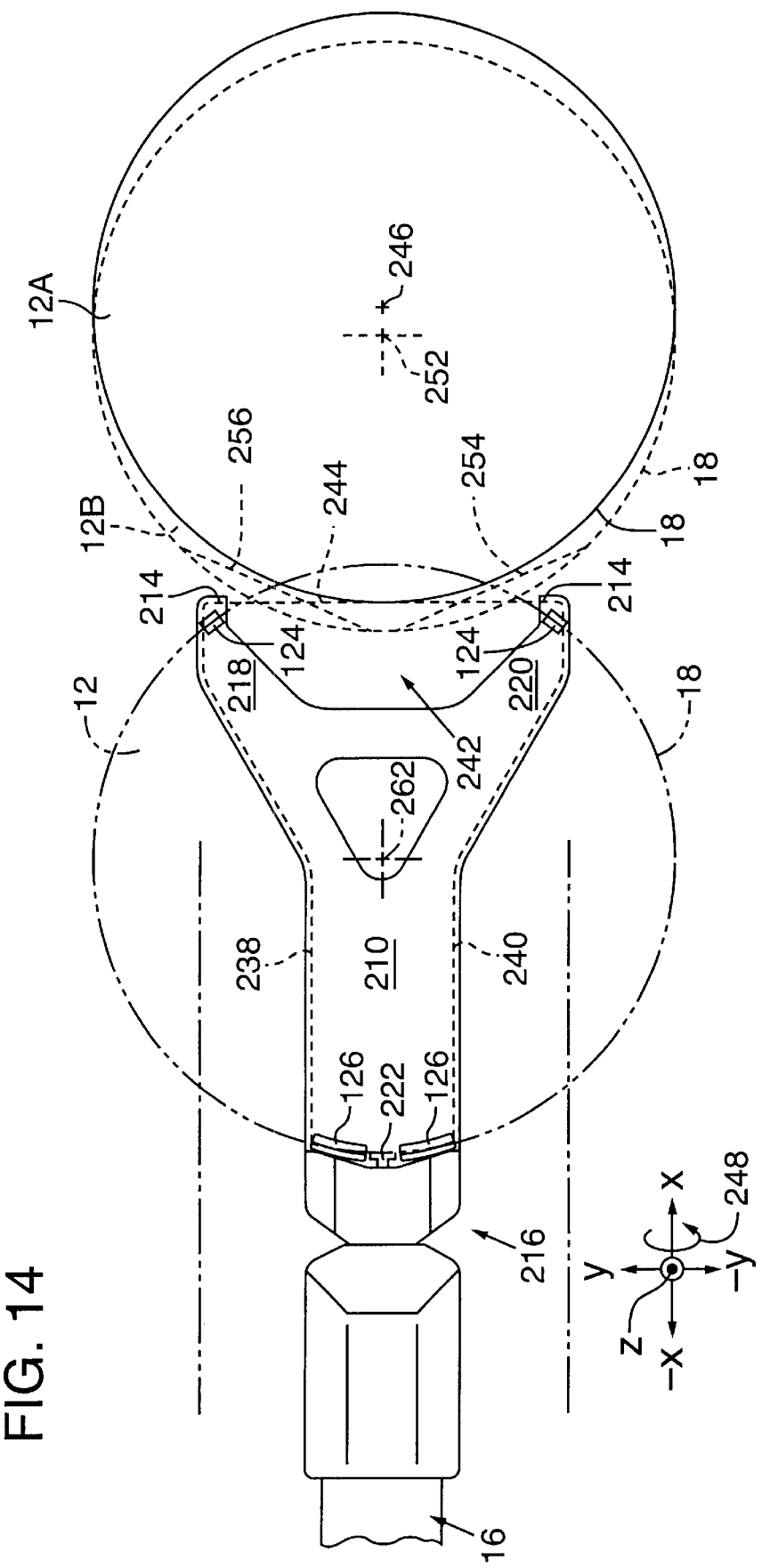
FIG. 14 is an overall plan view of the end effector of FIG. 12 showing alternate wafer gripping and sensing positions.

FIGS. 12, 13, and 14 show a third embodiment of a preferred fork-shaped end effector 210 of this invention for transferring semiconductor wafers, such as wafer 12 (shown transparent to reveal underlying structures), to and from wafer cassette 14 (not shown in these views). End effector 210 is similar to end effectors 10 and 110 but further includes a position sensing active contact point actuating mechanism 212, and deletes the proximal end edge and elevation sensors. Rather, end effector 210 employs distal end sensors 214 to accomplish various wafer sensing measurements. Distal end sensors 214 are implemented similarly to the elevation sensor generating light transmission pathway 202 as shown in FIGS. 7 and 10.

FIG. 13 shows that end effector 210 is particularly suited for retrieving and replacing wafer 12 from among closely spaced apart wafers, such as wafers 12, 12A, and 12B, which are shown as they might be stacked in wafer cassette 14.

FIG. 14 shows end effector 210 operably coupled to robot arm 16 at a proximal end 216 and extending to forked distal ends 218 and 220. End effector 210 receives wafer 12 between proximal end 216 and forked distal ends 218 and 220 and preferably includes at least two and, more preferably, four arcuate rest pads upon which wafer 12 is initially loaded. A distal arcuate rest pad 124 is located at, or adjacent to, each of forked distal ends 218 and 220; and at least one, but preferably two proximal arcuate rest pads 126 are located toward proximal end 216. End effector 210 also includes an active contact point 222 that is located at proximal end 216 of end effector 210 and between proximal arcuate rest pads 126.

Referring to FIGS. 12 and 13, position sensing active contact point actuating mechanism 212 is a third embodiment of the active contact point actuating mechanism. As in the second embodiment, active contact point 222 is operatively connected to piston 152 for reciprocation between fully retracted, fully extended, and intermediate positions. Piston 152 moves within bore 154 and is urged by a spring (FIG. 8) to extend active contact point 222 and by a vacuum pressure to retract active contact point 222. Active contact point 222 is connected to piston 152 by piston rod 156 that extends through annular airtight seal 158. Bore 154 includes end cap 159 that forms one wall of vacuum chamber 160, the other wall of which is movably formed by piston 152. Vacuum chamber 160 is in pneumatic communication with the vacuum pressure source (not shown) through vacuum feedthrough 162 and vacuum channel 164. The spring presses against the face of piston 152 to extend active contact point 222 to wafer-gripping and fully extended positions, whereas the vacuum pressure acts through vacuum chamber 160 against the face of piston 152 to overcome the spring force and retract active contact point 222 to wafer-releasing and fully retracted positions.

Actuating mechanism 212 further includes vent 168 in pneumatic communication with the atmosphere to allow free movement of piston 152 within the portion of bore 154 not in pneumatic communication with the vacuum pressure source. Actuating mechanism 212 is made "vacuum tight" by O-ring seals 170 surrounding end cap 159 and vacuum feedthrough 162, and by an annular moving seal 172 surrounding piston 152.

Unlike the first and second embodiments, actuating mechanism 212 further includes a position indicating shaft 224 attached to piston 152 and extending axially through an annular seal 226 in end cap 159. A pair of optical interrupter switches 228 and 230 are mounted to a circuit board 232 positioned just behind end cap 159 such that, depending on the position of indicating shaft 224, it interrupts a pair of light beams 234 and 236 in respective optical interrupter switches 228 and 230.

Optical interrupter switches 228 and 230 sense positions of active contact point 222 corresponding to a retracted position region, a safe gripping operation region, and an extended position region. (FIGS. 12 and 13 show active contact point 222 in a fully extended position.)

The retracted position region ensures that wafer 12 is not gripped and is sensed when position indicating shaft 224 interrupts both of light beams 234 and 236.

The safe gripping operation region is a range of active contact point 222 positions within which wafer loading, gripping, or unloading operation can be safely carried out and is sensed when position indicating shaft 224 interrupts light beam 236 but not light beam 234. Moreover, when active contact point 222 is extended and comes to rest in the safe gripping operation region, proper wafer gripping is verified.

The extended position region is a range of active contact point 222 positions within which wafer 12 is not gripped and is sensed when position indicating shaft 224 interrupts neither of light beams 234 and 236.

Optical interrupter switches 228 and 230 are in electrical communication with the above-referenced controller. The controller coacts with the vacuum pressure source actuating piston 152 to pulse or pressure regulate the amount of vacuum pressure and, thereby, control the positions of active contact point 222. Of course, various other forms of controllable motive forces may be employed to position active contact point 222.

In an operational example, active contact point 222 is moved to the safe gripping operation region and a wafer 12 is loaded into end effector 210. After wafer 12 is loaded, active contact point 222 is actuated to move wafer 12 into its gripped position. As active contact point 150 is extended, it urges wafer 12 up inclined pad portions 132 of distal arcuate rest pads 124 until wafer 12 is gripped. Active contact point 222 must be sensed in the safe gripping operating region to ensure that wafer 12 is properly gripped.

Wafer 12 is released by retracting active contact point 222 to the retracted position region as sensed by position indicating shaft 224 interrupting both of light beams 234 and 236. When wafer 12 is released, it slips back on inclined pad portions 132 of distal arcuate rest pads 124, thereby providing sufficient clearance between wafer 12 and backstop portion 134 for a safe Z-axis elevation move and retrieval of end effector 210.

FIG. 14 shows a top view of the third embodiment of end effector 210 in which the wafer edge sensors of end effectors 10 and 110 have been removed. Distal end sensors 214 of end effector 210 are housed in forked distal ends 218 and 220. Distal end sensors 214 are implemented as follows. A light source fiber is routed through a first channel 238 (shown in phantom lines) formed in the bottom surface of end effector 210 and running between proximal end 216 and forked distal end 218. In like manner, a light receiver fiber is routed through a second channel 240 (shown in phantom lines) formed in the bottom surface of end effector 210 and running between proximal end 216 and forked distal end 220. Forked distal ends 218 and 220 are widely spaced apart across a gap 242 that forms a relief region for certain types of processing equipment, such as wafer prealigners.

The light fibers terminate in mutually facing light path openings (not shown) formed in forked distal ends 218 and 220. The fibers form between them a wide opening that sights along the peripheral edge or the bottom surface chord of a wafer. The mutually facing light path openings form a narrow light transmission pathway 244 for detecting the presence or absence of the periphery or bottom surface chord of a wafer. Light transmission pathway 244 extends beyond the portion of forked distal ends 218 and 220 that would first contact a wafer, thereby further providing an obstruction sensing capability. As before, light source/receiver module 94 conventionally detects degrees of light transmission between the fibers and, thereby, senses any objects that interrupt light transmission pathway 244.

End effector 210 employs distal end sensors 214 to accomplish various wafer sensing measurements including sensing wafer protrusion from a cassette, wafer edge sensing, wafer top and bottom chord sensing, wafer tilt, wafer center determination, wafer thickness, center-to-center distance between the wafer and the robot arm rotational axis, and determining the end effector centroid. The sensing measurements are described with reference to light transmission pathway 244 of end effector 210, but they can also be accomplished with light transmission pathway 202 of end effector 110.

Three alternative wafer positions are shown in FIG. 14. Wafer 12 (shown in phantom) is shown gripped by end effector 210, wafer 12A (shown in solid lines) is shown in a wafer edge sensing position, and wafer 12B (shown in phantom) is shown in a wafer chord sensing position.

Sensing wafer 12B protrusion from a cassette (not shown) entails stepping robot arm 16 up and down in the Z-axis direction while also moving end effector 210 in the X-axis direction until wafer 12B is detected. Prior robot arm systems typically employed a dedicated protrusion sensor. Robot arm 16 X–and Z-axis movements are preferably in a fine resolution mode.

After light transmission pathway 244 is interrupted, indicating detected presence of wafer 12B, end effector can find wafer 12B top and bottom surfaces by moving end effector 210 downward in the Z-axis direction until a top surface chord of wafer 12B interrupts light transmission pathway 244. End effector 210 continues moving downward until light transmission pathway 244 is restored. This point represents sensing a bottom surface chord of wafer 12B. End effector 210 is then moved to a Z-axis position midway between the points of interruption and restoration of light transmission pathway. This Z-axis position represents the approximate midpoint of wafer 12B thickness. While maintaining this Z-axis position, end effector 210 is retracted in the X-axis direction until light transmission pathway 244 is restored, indicating that periphery 18 of the wafer has been detected. Wafer 12A is shown in this position.

When end effector 210 is at the edge detection point represented by wafer 12A and because the radius of wafer 12A is known, the controller and position encoders associated with robot arm 16 can determine the X-axis direction distance to a center 246 of wafer 12A and a downward Z-axis distance required to provide clearance between the bottom surface of wafer 12A and end effector 210. Knowing the clearance is necessary when placing and retrieving wafers from the cassette because the wafers are not necessarily parallel to end effector 210 and distances between adjacent wafers in the cassette can be tight.

End effector 210 further includes a controllable supination angle 248, which is the tilt angle about the X-axis of end effector 210 relative to a Y-axis. Wafers stacked in a cassette would have their major surface planes at a predetermined tilt angle, preferably zero degrees, that should be matched by supination angle 248 of end effector 210. To determine whether supination angle 248 is level with the tilt angle of a wafer, robot arm 16 moves end effector 210 up and down in the Z-axis direction while dithering its supination angle 248 until a minimum wafer thickness is computed, which indicates that end effector 210 and the wafer are in the same datum plane. Robot arm systems can be equipped with two end effectors or multiple arms (see FIGS. 15A and 15B for dual arm robot). The technique described above for a controllable supination angle can be extended to such multiple end effector systems by using a single wafer as a reference to determine the X, Y, and Z dimension offsets among them.

Light transmission pathway 244 may also be employed to determine the X-axis position of a wafer in the cassette or on a prealigner. This determination entails finding the minimum distance between a shoulder axis 316 of robot arm 16 and the front of a wafer, for example, wafer 12B. Finding this minimum distance then provides the corresponding robot arm extension and angle values. The determination entails angularly displacing robot arm 16 such that light transmission pathway 244 intersects wafer 12B at two different chord positions, such as chord positions 264 and 256. There is a variety of available search routines that can be used to compute this minimum distance. This distance determination is accomplished without any of the teaching fixtures required by prior robot arms and end effectors. If multiple end effectors 210 are employed, the foregoing procedure can be repeated together with determining any Z-axis elevation difference between them.

Referring to FIG. 5, it should be noted that the U-shaped edge detecting sensors in housing 80 and 82 are useful for determining certain parameters of a flatless 300 mm wafer. For instance, the edge detecting sensors can be employed to determine the center-to-center distance between shoulder axis 316 of robot arm 16 and a wafer center while the wafer is in the cassette or end effector 10 is positioned beneath the wafer. Of course, the Z-axis dimension of U-shaped openings 88 (FIG. 6A) presents a potential spacing problem.

Referring again to FIG. 14, light transmission pathway 244 may also be used in combination with the supination capability of end effector 210 to determine whether a centroid 250 of end effector 210 is axially aligned with center 252 of wafer 12B. Ideally, centroid 250 is coaxial with the center of gripped wafer 12 and lies on an imaginary line extending between shoulder axis 316 and center 252 of wafer 12B. However, manufacturing tolerances and the positionings of features creating light transmission pathway 244 may cause a calculated position of centroid 250 to be offset from the supination axis of rotation. Determining whether centroid 250 is offset or coincident entails carrying out the above-referenced robot arm 16 movements and distance calculations to determine the location of center 252 of wafer 12B, rotating end effector 210 through a supination angle 248 of 180 degrees and repeating the center 252 location calculation. If the centroid is offset, the calculated location of center 252 will be in a mirror image position on the opposite side of the supination axis of rotation. The correct location for centroid 250 is determined by averaging the two calculated locations for center 252 of wafer 12B.

The above-described embodiments are merely illustrative of the principles of the invention. Various modifications and changes may be made thereto by those skilled in the art that will embody the principles of the invention and fall within the spirit and scope thereof. For example, skilled workers will understand that the pistons may be actuated by alternative power sources, such as, for example, by a pulsing solenoid that slows the pistons as wafer 12 is secured. Electric signals may be employed to drive and monitor the positioning of the pistons. The pistons may also be pneumatically operated and monitored, such as in applications where the end effectors are submerged in a liquid. The end effectors may be forked or otherwise include a cutout or be shaped to avoid obstacles, such as a prealigner hub. The sensors preferably employ laser beams from light-emitting diodes and diode lasers, but may also employ incandescent, infrared, and other radiation sources. Moreover, the end effector is usable for handling various types of specimens other than semiconductor wafers, such as compact diskettes and computer memory discs.

Figure 16:
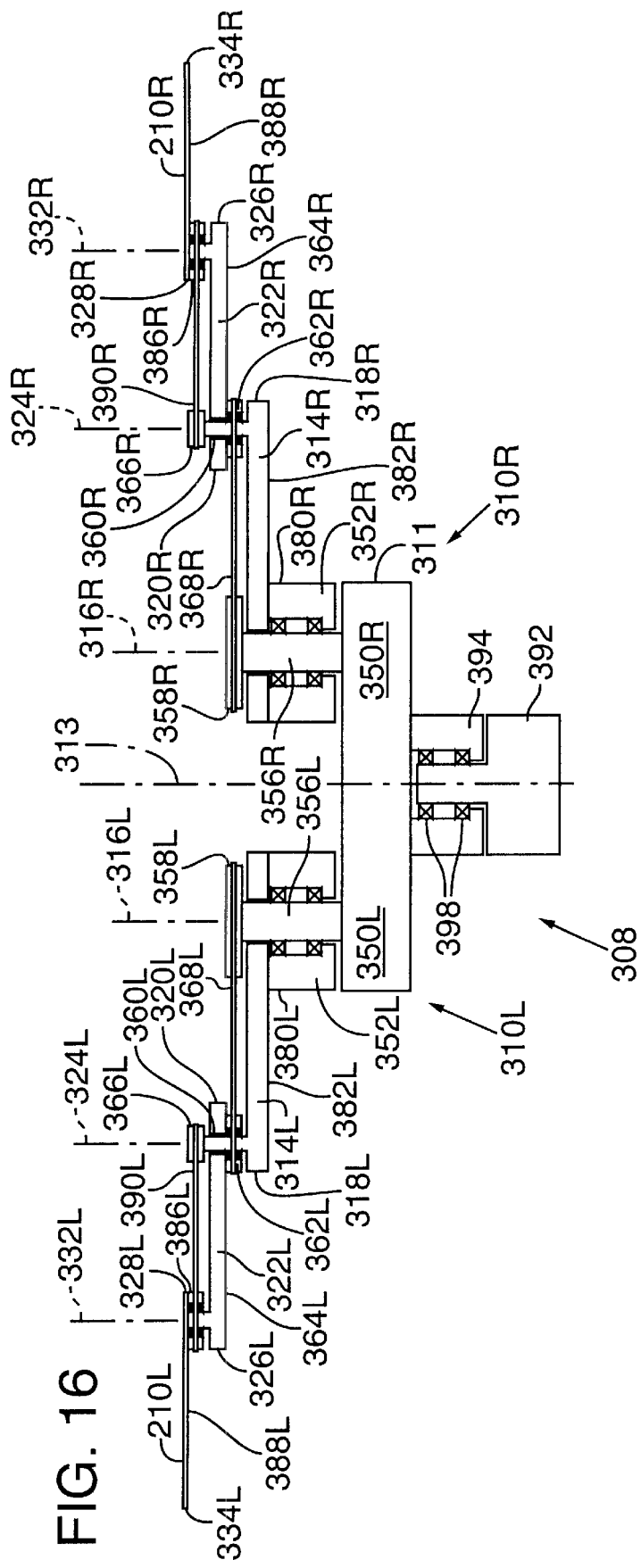
FIG. 16 is a side elevation view in stick diagram form showing the link components and the associated mechanical linkage of the robot arm system of FIGS. 15A and 15B.
Figure 17:
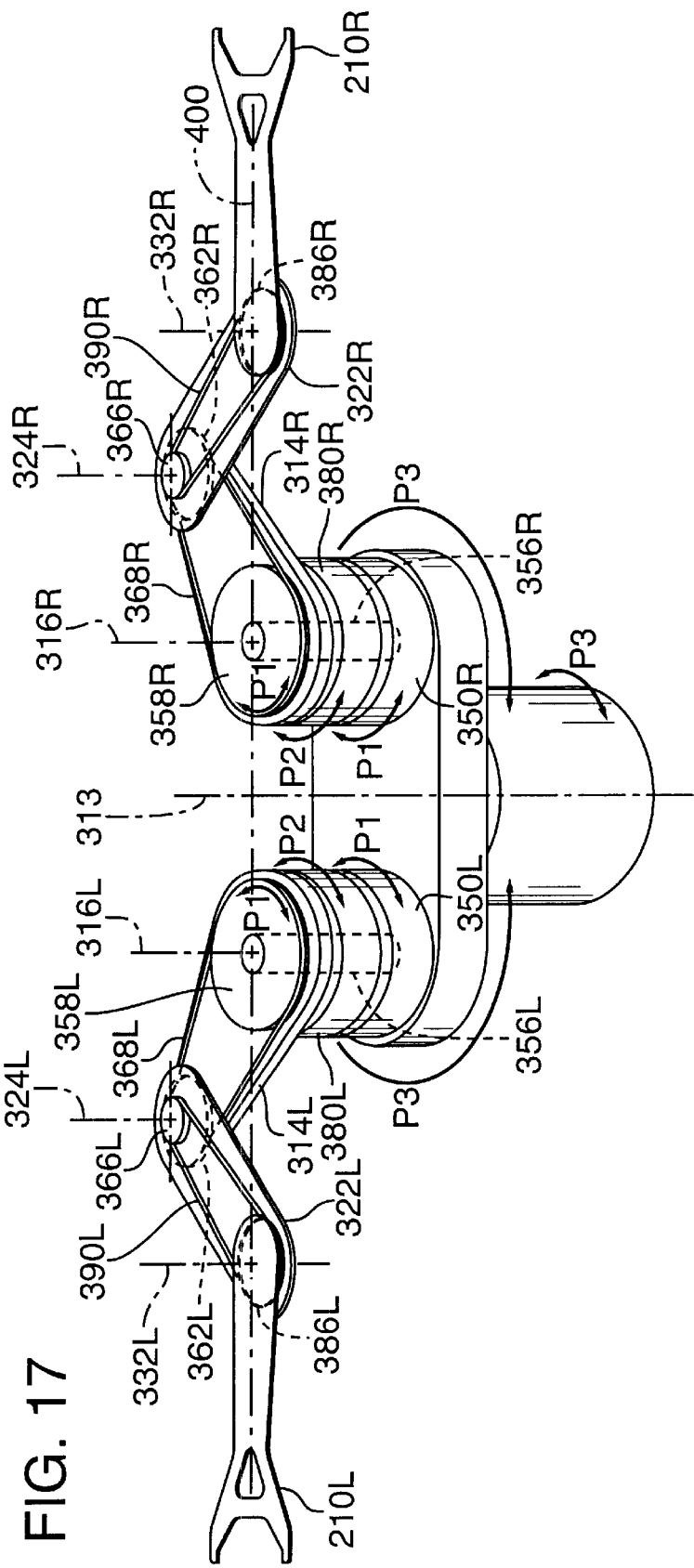
FIG. 17 is an isometric view in stick diagram form showing the rotational motion imparted by the motor drive links of the mechanical linkage of the robot arm system of FIGS. 15A and 15B.
Figure 18A:
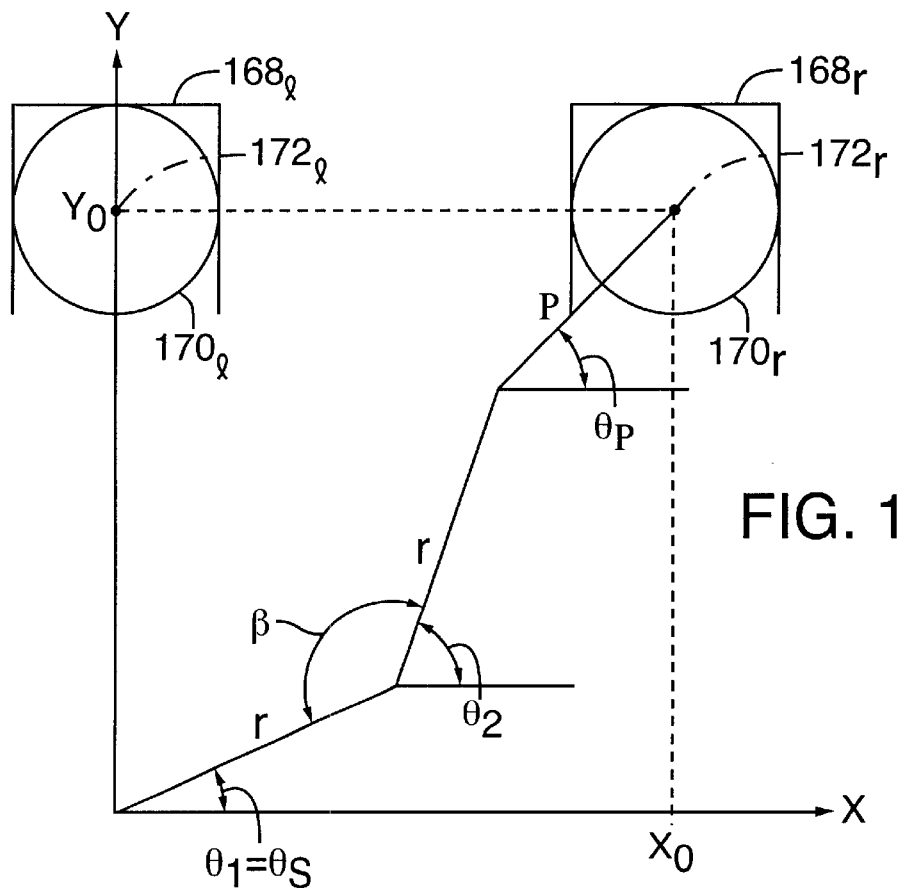
FIG. 18A is a diagram showing the spatial relationships and parameters that are used to derive control signals provided by, and FIG. 18B is a block diagram of, the motor controller for the robot arm system of FIGS. 15A and 15B.
Figure 18B:
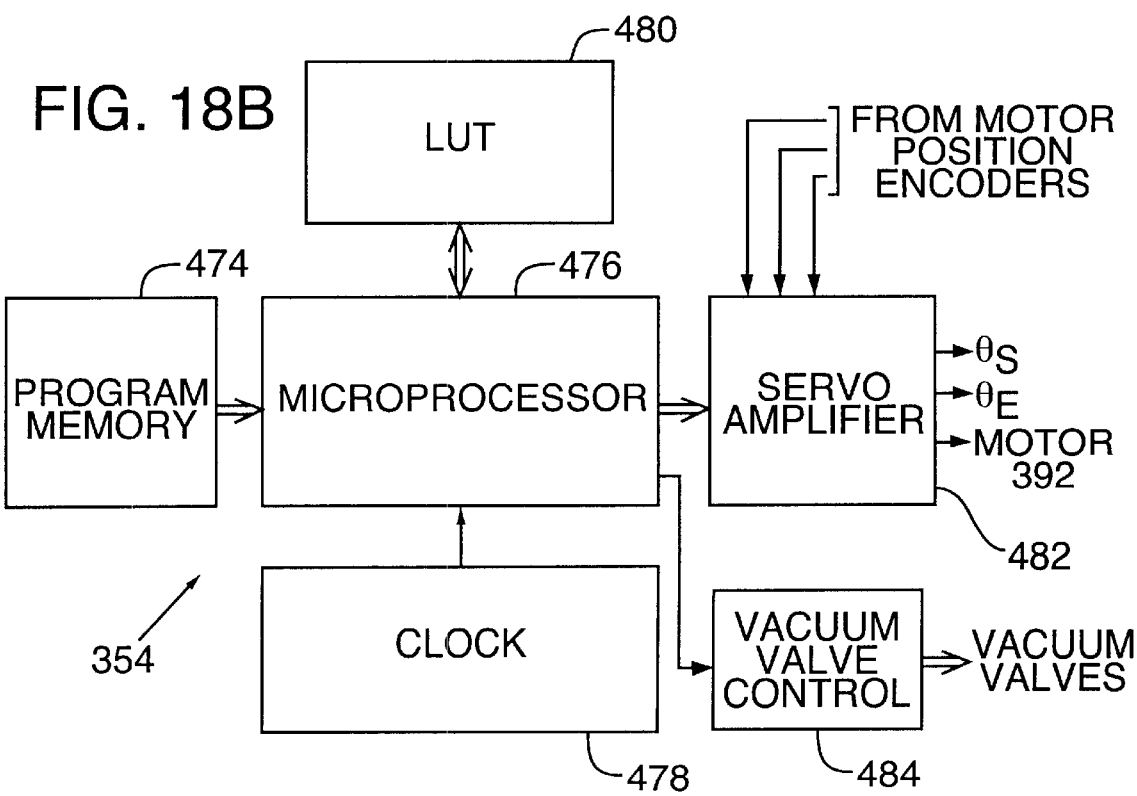

FIGS. 15A and 15B and FIGS. 16 and 17 show a type of multiple link robot arm system 308 to which end effector 210 is mountable. FIGS. 18A and 18B present in conjunction with pertinent mathematical expressions characterizing robot arm displacement an example of positioning robot arm mechanism 368 to demonstrate the manipulation of the linear and angular displacement values necessary to compute the parameters associated with the various wafer sensing measurements described above. U.S. Pat. No. 5,765,444 provides a detailed description of the construction and operation of this type of robot arm system.

Figure 15:
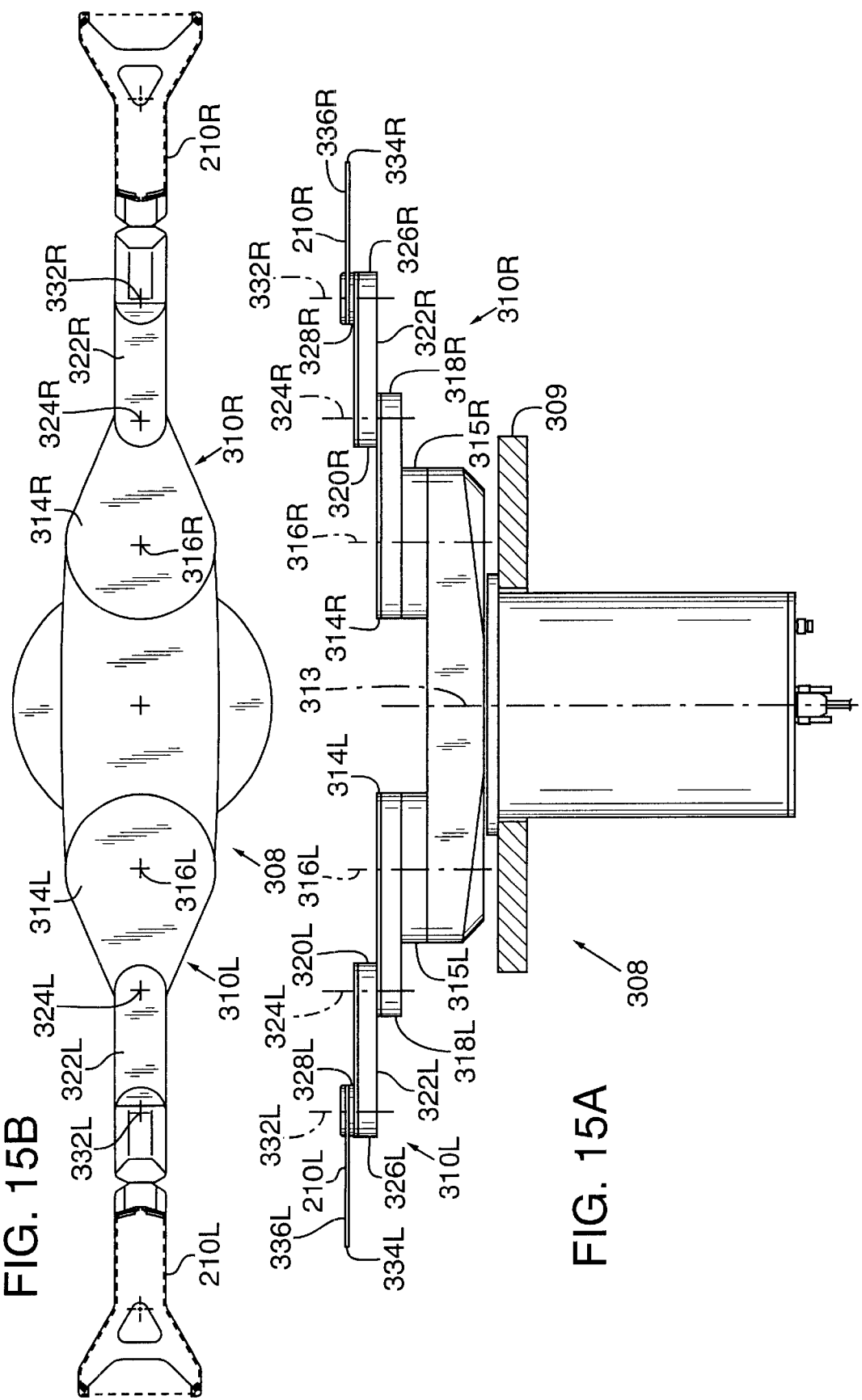
FIGS. 15A and 15B are respective side elevation and plan views of an exemplary two-arm, multiple link robot arm system from which the end effector of the present invention extends.

FIGS. 15A and 15B are respective side elevation and plan views of a two-arm, multiple link robot arm system 308 mounted on and through an aperture in the top surface of a support table 309. With reference to FIGS. 15A and 15B, two similar but independently controllable three-link robot arm mechanisms 310L and 310R are rotatably mounted at opposite ends of a torso link 311, which is mounted to the top surface of a base housing 312 for rotation about a central or torso axis 313. Because they are mirror images of each other, robot arm mechanisms 310L and 310R have corresponding components identified by identical reference numerals followed by the respective suffices "L" and "R". Accordingly, the following discussion is directed to the construction and operation of only robot arm mechanism 310R but is similarly applicable to robot arm mechanism 310L.

Robot arm mechanism 310R comprises an upper arm 314R mounted to the top surface of a cylindrical spacer 315R, which is positioned on the right-hand end of torso link 311 for rotation about a shoulder axis 316R. Cylindrical spacer 315R provides room for the motors and certain other components of robot arm mechanism 310R, as will be described below. Upper arm 314R has a distal end 318R to which a proximal end 320R of a forearm 322R is mounted for rotation about an elbow axis 324R, and forearm 322R has a distal end 326R to which a proximal end 328R of end effector or hand 210R is mounted for rotation about a wrist axis 332R. Hand 210R is equipped at its distal end 334R with a fluid pressure outlet 336R that preferably applies vacuum pressure supplied to robot arm mechanism 310R at an inlet 338 to vacuum channel 164 to securely hold semiconductor wafer 12, a compact disk, or other suitable specimen (not shown) in place on hand 210R. As will be described in detail later, each of upper arm 314R, forearm 322R, and hand 210R is capable of continuous rotation about its respective shoulder axis 316R, elbow axis 324R, and wrist axis 332R.

FIG. 16 shows the link components and associated mechanical linkage of robot arm mechanism 310R. With reference to FIG. 16, robot arm mechanism 310R is positioned by first and second concentric motors 350R and 352R that operate in response to commands provided by a motor controller 354 (FIGS. 18A and 18B). First motor 350R rotates forearm 322R about elbow axis 324R, and second motor 352R rotates upper arm 314R about shoulder axis 316R.

More specifically, first motor 350R rotates a forearm spindle 356R that extends through an aperture in upper arm 314R and terminates in an upper arm pulley 358R. A post 360R extends upwardly at distal end 318R of upper arm 314R through the center of a bearing 362R that is mounted to a bottom surface 364R of forearm 322R at its proximal end 320R. Post 360R also extends through an aperture in forearm 322R and terminates in a forearm pulley 366R. An endless belt 368R connects upper arm pulley 358R and the outer surface of bearing 362R to rotate forearm 322R about elbow axis 324R in response to rotation of first motor 350R.

Second motor 352R rotates an upper arm spindle 380R that is mounted to a bottom surface 382R of upper arm 314R to rotate upper arm 314R about shoulder axis 316R. Coordinated operation of first and second motors 350R and 352R in conjunction with the mechanical linkage described below causes hand 210R to rotate about shoulder axis 316R. A post 384R extends upwardly through the center of a bearing 386R that is mounted to a bottom surface 388R of hand 210R. An endless belt 390R connects forearm pulley 366R to the outer surface of bearing 386R to rotate hand 210R about shoulder axis 316R in response to the coordinated rotational motions of motors 350R and 352R.

The active linkage coupling upper arm 314R and forearm 332R forms an active drive link and a passive drive link. The active drive link includes belt 368R connecting upper arm pulley 358R and the outer surface of bearing 362R and causes forearm 322R to rotate in response to rotation of first motor 350R. The passive drive link includes belt 390R connecting forearm pulley 366R and the outer surface of bearing 386R and causes hand 210R to rotate about wrist axis 332R in response to rotation of forearm 322R about elbow axis 324R. Rotation of hand 210R can also be caused by a complex interaction among the active and passive drive links and the rotation of upper arm 314R in response to rotation of second motor 352R.

A third or torso motor 392 rotates a torso link spindle 394 that is mounted to a bottom surface of torso link 311, to which robot arm mechanism 310R is rotatably mounted. A main ring 396 supports a bearing assembly 398 around which spindle 394 rotates. Motor 392 is capable of 360 degree continuous rotation about central axis 313 and therefore can, in cooperation with robot arm mechanism 310R, move hand 210R along an irregular path to any location within the reach of hand 210R.

Motor controller 54 (FIGS. 18A and 18B) controls motors 350R and 352R in two preferred operational states to enable robot arm mechanism 310R to perform two principal motion sequences. The first motion sequence changes the extension or radial position of hand 210R, and the second motion sequence changes the angular position of hand 210R relative to shoulder axis 316R. FIG. 17 is a useful diagram for showing the two motion sequences.

With reference to FIGS. 16 and 17, in the first operational state, motor controller 354 causes first motor 350R to maintain the position of forearm spindle 356R and second motor 352R to rotate upper arm spindle 380R. The non-rotation of first motor 350R maintains the position of upper arm pulley 38R, and the rotation of upper arm spindle 380R by second motor 352R rotates upper arm 314R about shoulder axis 316R, thereby causing rotation of forearm 322R about elbow axis 324R and counter-rotation of hand 210R about wrist axis 332R. Because the ratio of the diameters of upper arm pulley 358R and the outer surface of bearing 362R are 4:2 and the ratio of the diameters of forearm pulley 366R and the outer surface of bearing 386R is 1:2, the rotation of upper arm 314R in a direction specified by $P_2$ shown in FIG. 17 will cause hand 210R to move along a straight line path 400. (The diameters of forearm pulley 366R and the outer surface of bearing 386R are one-half of the diameters of, respectively, the outer surface of bearing 362R and upper arm pulley 358R to streamline the sizes and shapes of forearm 322R and hand 210R.)

Whenever upper arm 314R rotates in the clockwise direction specified by $P_2$, hand 210R extends (i.e., increases radial distance from shoulder axis 16R) along path 400. Whenever upper arm 314R rotates in the counter-clockwise direction specified by $P_2$, hand 210R retracts (i.e., decreases radial distance from shoulder axis 316R) along path 400. Skilled persons will appreciate that robot arm mechanism 310 in a mirror image configuration of that shown in FIG. 17 would extend and retract in response to upper arm 314 rotation in directions opposite to those described. FIG. 15B shows that when robot arm mechanism 310R is extended, axes 313, 316R, 324R, and 332R are collinear.

In the second operational state, motor controller 352R causes first motor 350R to rotate forearm spindle 356R in the direction specified by $P_1$ and second motor 352R to rotate upper arm spindle 380R in the direction specified by $P_2$. In the special case in which motors 350R and 352R are synchronized to rotate in the same direction by the same amount of displacement, hand 210R is only angularly displaced about shoulder axis 316R. This is so because the rotation of forearm 322R about elbow axis 324R caused by the rotation of first motor 350R and the rotation of hand 330R about wrist axis 332R caused by rotation of second motor 352R and the operation of the passive drive link offset each other to produce no net rotation about elbow axis 324R and wrist axis 332R. Thus, hand 210R is fixed radially at a point along path 400 and describes a circular path as only upper arm 314R rotates about shoulder axis 316R. By application of kinematic constraints to achieve a desired travel path for hand 210, motor controller 354 can operate first and second motors 350R and 352R to move robot arm mechanism 310R along non-radial straight line paths, as will be further described below.

Skilled persons will appreciate that to operate robot arm mechanism 310R, first and second motors 350R and 352R are coupled by either rotating both of them or grounding one while rotating the other one. For example, robot arm mechanism 310R can be operated such that forearm 322R rotates about elbow axis 324R. Such motion would cause hand 210R to describe a simple spiral path between shoulder axis 316R and the full extension of hand 210R. This motion is accomplished by fixing the position of shoulder 314R and operating motor 350R to move forearm 322R.

Motor controller 354 controls the operation of torso motor 392 and therefore the rotation of torso link 311 in a direction specified by $P_3$ independently of the operational states of motors 350R and 352R.

The angular positions of motors 350R and 352R are tracked by separate glass scale encoders (not shown). Each of the encoders typically includes an annular diffraction grating scale and a light source/detector subassembly (not shown). Such glass scale encoders are known to skilled persons. The angular position of motor 392 is tracked by a glass scale the encoder of a type similar to the encoders for motors 350R and 352R.

FIG. 18A is a diagram that specifies a local coordinate axis frame whose axes are defined by the orientation of a semiconductor wafer cassette $168_r$ and its location relative to shoulder axis 316R. With reference to FIG. 18A, the following description sets forth the mathematical expressions from which are derived the command signals controller 354 uses to retrieve from cassette $168_r$ a wafer $170_r$ along a vector perpendicular to the opening of cassette $168_r$. (Skilled persons will appreciate that similar mathematical expressions can be used for different drive ratios from the above-stated drive ratio on which this example is based.)

The following parameters are pertinent to the derivation of the path of travel of hand 210:

$\Theta_S$=angle of motor 352R $\Theta_E$=angle of motor 350R r=distance between shoulder axis 316R and elbow axis 324R and distance between elbow axis 324R and wrist axis 332R $\beta$=angle between upper arm 314R and forearm 322R p=length of hand 210R E=2r=extension of robot arm $R_i$=reach of robot arm (i.e., its radius measured from shoulder axis 316R to the center $172_r$ of wafer $170_r$ positioned on hand 210R).

Application of the law of cosines provides the following expressions for $R_i$:

$$R_i = p + \sqrt{(r^2 + r^2 - 2r^2 \cos\beta)} \quad (1)$$
$$= p + \sqrt{2}\, r\sqrt{(1 - \cos\beta)}.$$

For $\beta=0$, equation (1) provides that $R_i=p$ and $x=0$, $Y=0$, $\Theta_S=\Theta_{S_R}$, $\Theta_E=\Theta_{E_R}$. The quantities $\Theta_{S_R}$ and $\Theta_{E_R}$ represent reference motor angles. The motor angles may be expressed as $\Theta_S=\Theta_{S_R}+\Delta\Theta_{S_R}$, $\Theta_E=\Theta_{E_R}+\Delta\Theta_{E_R}$. The angle $\beta$ may be expressed as $\beta=2(\Delta\Theta_{S_R}-\Delta\Theta_{E_R})$ because of the construction of the mechanical linkages of robot arm mechanism 310R. This equation relates the angle $\beta$ to changes in the motor angles.

To retrieve wafer $170_r$ from cassette $168_r$ along a straight line path, the displacement along the X-axis equals $X_0$, which is a constant. Thus, $X(t)=X_0$. The quantity $X(t)$ can be expressed as a function of the lengths of the X-axis components of its links:

$$X(t) = r \cos \Theta_1 + r \cos \Theta_2 + p \cos \Theta_p, \quad (2)$$

in which $\Theta_1$=angle of upper arm 314R $\Theta_2$=angle of forearm 322R $\Theta_p$=angle of hand 210R.

Because upper arm 314R and forearm 322R are of the same length (r), $\Theta_1$ tracks the angle $\Theta_S$ of motor 352R, and hand 210R moves in a straight line, the following expressions hold:

$$\Theta_1 = \Theta_S$$
$$\Theta_2 = \Theta_1 + \pi - \beta$$
$$\Theta_p = \Theta_1 + \left(\frac{\pi - \beta}{2}\right).$$

Thus, to compute $X_0$, one substitutes the foregoing identities for $\Theta_1$, $\Theta_2$, and $\Theta_p$ into equation (2) for $X(t)$ and finds:

$$X_0 = r(\cos\Theta_1 + \cos\Theta_2) + p\cos\Theta_p \quad (3)$$
$$X_0 = r(\cos\Theta_1 + \cos(\Theta_1 + \pi - \beta)) + p\cos\left(\Theta_1 + \frac{\pi}{2} - \frac{\beta}{2}\right)$$
$$X_0 = r(\cos\Theta_1 - \cos(\Theta_1 - \beta)) - p\sin\left(\Theta_1 - \frac{\beta}{2}\right).$$

Equation (3) expresses the constraint that sets out the relationship between the angles $\Theta_S$ and $\Theta_E$ of motors 352R and 350R operating to move equal angular distances to achieve straight line movement of hand 210R.

Skilled persons can implement constraint equation (3) by means of a servomechanism controller in any one of a number of ways. For example, to achieve high speed operation to implement a given wafer move profile, one can compute from equation (3) command signal values and store them in a look-up table for real-time use. The precomputation process would entail the indexing of $\Theta_S$ in accordance with the wafer move profile and determining from equation (3) the corresponding $\Theta_E$ values, thereby configuring the displacement of $\Theta_S$ and $\Theta_E$ in a master-slave relationship.

To achieve angular displacement of hand 210R about shoulder axis 316R, controller 354 causes motors 350R and 352R to rotate in the same direction through the desired angular displacement of hand 330R to reach the desired destination. The linear extension of hand 330R does not change during this move. Skilled persons will appreciate that complicated concurrent linear and angular displacement move profiles of hand 330R could be accomplished by programming controller 354 to operate motors 350R and 352R through different angular displacements. FIG. 6A shows a second wafer cassette $168_l$ positioned so that the center $172_l$ of a stored wafer $170_l$ is coincident to $Y_0$. The parallel arrangement of the openings of cassettes $168_l$ and $168_r$ demonstrates that the above expressions can be used to retrieve wafers stored in cassettes not positioned a radial distance from shoulder axis 316. Robot arm mechanism 310 is not restricted to radial placement but can accommodate any combination of distances within its reach.

FIG. 18B is a simplified block diagram showing the primary components of controller 354. With reference to FIG. 18B, controller 354 includes a program memory 474 that stores move sequence instructions for robot arm mechanism 310R. A microprocessor 476 receives from program memory 474 the move sequence instructions and interprets them to determine whether the first or second operational state is required or whether motion of motor 392 is required to position torso link 311. A system clock 478 controls the operation of microprocessor 476. A look-up table (LUT) 480 stores corresponding values for $\Theta_S$ (motor 352R) and $\Theta_E$ (motor 350R) to accomplish the straight line motion of the first operational state and the angular displacements of $\Theta_S$ and $\Theta_E$ to accomplish the angular motion of the second operational state. Because the rotation of torso link 311 is independent of the motions of the robot arm mechanisms mounted to it, the overall coordination of the angular displacement of motor 392 with the angular displacements of motors 350R and 352R is carried out in the move sequence instructions, not in LUT 180. This results in higher speed and more accurate straight line motion because multiple axis servomechanism following errors and drive accuracy errors do not affect the straight line path of hand 210R.

Microprocessor 476 provides $\Theta_S$ is and $\Theta_E$ position signals to a servomechanism amplifier 482, which delivers $\Theta_S$ and $\Theta_E$ command signals to motors 352R and 350R, respectively. Microprocessor 476 also provides position signals to servomechanism amplifier 476 to deliver a command signal to torso motor 392. Servomechanism amplifier 482 receives from the three glass scale encoders signals indicative of the angular positions of the respective motors 350R, 352R, and 392.

Microprocessor 476 also provides control signals to a vacuum valve controller 484, which causes a vacuum valve (not shown) to provide from a vacuum source (not shown) an appropriate amount of vacuum pressure to outlet 336 in response to the need to hold a wafer on or release a wafer from hand 210R.

It will be further obvious to those having skill in the art that many changes may be made to the details of the above-described embodiments of this invention without departing from the underlying principles thereof. The scope of the present invention should, therefore, be determined only by the following claims.

We claim:

1. A method of using an end effector to determine a thickness dimension of a specimen stored in a container having an open end through which the specimen can be placed in and removed from the container, the thickness dimension defined by first and second opposed major surfaces of the specimen, comprising:

providing an end effector having a body operatively connected to a light source and a light receiver, the light source and light receiver having spaced-apart respective source light path and receiver light path openings between which a light beam propagates along a straight line light transmission pathway;

causing the specimen to intersect the light transmission pathway and thereby interrupt the light beam;

imparting relative motion between the specimen and the body in either of first and second measurement directions along a travel path that is transverse to the straight line light transmission pathway the first and second directions being opposite to each other;

recording for the first and second measurement directions of relative motion along the travel path respective first and second position information corresponding to spatial coordinate positions at which the light transmission pathway is restored; and using the first and second position information to determine the thickness dimension defined by the first and second opposed major surfaces of the specimen.

2. The method of claim 1, in which the first and second opposed major surfaces of the specimen are substantially planar and generally parallel to each other.

3. The method of claim 2, in which the specimen is a semiconductor wafer.

4. The method of claim 1, in which the container is a semiconductor wafer cassette and the specimen is a semiconductor wafer.

5. The method of claim 1, in which the specimen is a semiconductor wafer that is of generally circular shape with a flat peripheral portion having a length, the source and receiver light path openings being separated by a distance that is greater than the length of the flat peripheral portion.

6. The method of claim 1, in which the imparting of relative motion between the specimen and the body comprises:

imparting relative motion between the specimen and the body in the first measurement direction to restore the light transmission pathway at a first specimen surface location, the first specimen surface location corresponding to the first position information;

imparting relative motion between the specimen and the body in the second measurement direction so that the specimen interrupts the light transmission pathway; and continuing the relative motion between the specimen and the body in the second measurement direction to restore the light transmission pathway at a second specimen surface location, the second specimen surface location corresponding to the second position information.

7. The method of claim 6, in which the first and second opposed major surfaces of the specimen are substantially planar and generally parallel to each other.

8. The method of claim 7, in which the specimen is a semiconductor wafer.

* * * * *